United States Patent
Karnezos et al.

(12)

(10) Patent No.: US 7,372,141 B2
(45) Date of Patent: May 13, 2008

(54) SEMICONDUCTOR STACKED PACKAGE ASSEMBLY HAVING EXPOSED SUBSTRATE SURFACES ON UPPER AND LOWER SIDES

(75) Inventors: Marcos Karnezos, Palo Alto, CA (US); Il Kwon Shim, Rosewood Condo (SG); Byung Joon Han, Singapore (SG); Kambhampati Ramakrishna, Chandler, AZ (US); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/395,529

(22) Filed: Mar. 31, 2006

(65) Prior Publication Data
US 2006/0220209 A1   Oct. 5, 2006

Related U.S. Application Data

(63) Continuation-in-part of application No. 11/306,628, filed on Jan. 4, 2006.

(60) Provisional application No. 60/692,182, filed on Jun. 20, 2005, provisional application No. 60/667,277, filed on Mar. 31, 2005.

(51) Int. Cl.
*H01L 23/02* (2006.01)
*H01L 21/00* (2006.01)
*H05K 1/14* (2006.01)

(52) U.S. Cl. .................. 257/686; 257/730; 257/780; 257/784; 361/784; 361/790; 361/792; 438/109; 438/125

(58) Field of Classification Search .............. None
See application file for complete search history.

(56) References Cited

U.S. PATENT DOCUMENTS

| 5,222,014 A | 6/1993 | Lin |
| 5,229,960 A | 7/1993 | De Givry |

(Continued)

FOREIGN PATENT DOCUMENTS

EP   0 430 458 A2   6/1991

(Continued)

OTHER PUBLICATIONS

International Search Report and Written Opinion for corresponding International Application No. PCT/US06/11712 dated Mar. 1, 2007.

(Continued)

*Primary Examiner*—Alonzo Chambliss

(57) ABSTRACT

Stacked package assemblies include first and second stacked packages, each having at least one die affixed to, and electrically interconnected with, a die attach side of the package substrate. One package is inverted in relation to the other, that is, the die attach sides of the package substrates face one another, and the "land" sides of the substrates face away from one another. Z-interconnection of the packages is by wire bonds connecting the first and second package substrates. The assembly is encapsulated in such a way that both the second package substrate (one side of the assembly) and a portion of the first package substrate (on the opposite side of the assembly) are exposed, so that second level interconnection and interconnection with additional components may be made. One or more additional components may be stacked over the land side of the first package substrate.

24 Claims, 18 Drawing Sheets

U.S. PATENT DOCUMENTS

| | | |
|---|---|---|
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |
| 5,744,863 A | 4/1998 | Culnane et al. |
| 5,898,219 A | 4/1999 | Barrow |
| 5,899,705 A | 5/1999 | Akram |
| 5,903,049 A | 5/1999 | Mori |
| 5,977,640 A | 11/1999 | Bertin et al. |
| 5,982,633 A | 11/1999 | Jeansonne |
| 5,994,166 A | 11/1999 | Akram et al. |
| 6,025,648 A | 2/2000 | Takahashi et al. |
| RE36,613 E * | 3/2000 | Ball .................. 257/777 |
| 6,034,875 A | 3/2000 | Heim et al. |
| 6,075,289 A | 6/2000 | Distefano |
| 6,083,775 A | 7/2000 | Huang et al. |
| 6,118,176 A | 9/2000 | Tao et al. |
| 6,133,626 A | 10/2000 | Hawke et al. |
| 6,157,080 A | 12/2000 | Tamaki et al. |
| 6,165,815 A | 12/2000 | Ball |
| 6,201,266 B1 | 3/2001 | Ohuchi et al. |
| 6,201,302 B1 | 3/2001 | Tzu |
| 6,238,949 B1 | 5/2001 | Nguyen et al. |
| 6,265,766 B1 | 7/2001 | Moden |
| 6,274,930 B1 | 8/2001 | Vaiyapuri et al. |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,376,904 B1 | 4/2002 | Haba et al. |
| 6,388,313 B1 | 5/2002 | Lee et al. |
| 6,400,007 B1 | 6/2002 | Wu et al. |
| 6,407,456 B1 | 6/2002 | Ball |
| 6,413,798 B2 | 7/2002 | Asada |
| 6,414,381 B1 | 7/2002 | Takeda |
| 6,424,050 B1 | 7/2002 | Komiyama |
| 6,441,496 B1 | 8/2002 | Chen et al. |
| 6,445,064 B1 | 9/2002 | Ishii et al. |
| 6,462,421 B1 | 10/2002 | Hsu et al. |
| 6,472,732 B1 | 10/2002 | Terui |
| 6,489,676 B2 | 12/2002 | Taniguchi et al. |
| 6,492,726 B1 | 12/2002 | Quek et al. |
| 6,501,165 B1 | 12/2002 | Farnworth et al. |
| 6,509,639 B1 | 1/2003 | Lin |
| 6,512,303 B2 | 1/2003 | Moden |
| 6,538,319 B2 | 3/2003 | Terui |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,555,917 B1 | 4/2003 | Heo |
| 6,570,249 B1 | 5/2003 | Liao et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,611,063 B1 | 8/2003 | Ichinose et al. |
| 6,621,169 B2 | 9/2003 | Kikuma et al. |
| 6,621,172 B2 | 9/2003 | Nakayama et al. |
| 6,649,448 B2 | 11/2003 | Tomihara |
| 6,650,019 B2 | 11/2003 | Glenn et al. |
| 6,667,556 B2 | 12/2003 | Moden |
| 6,690,089 B2 | 2/2004 | Uchida |
| 6,700,178 B2 | 3/2004 | Chen et al. |
| 6,706,557 B2 | 3/2004 | Koopmans |
| 6,716,670 B1 | 4/2004 | Chiang |
| 6,734,539 B2 | 5/2004 | Degani et al. |
| 6,734,552 B2 | 5/2004 | Combs et al. |
| 6,737,750 B1 | 5/2004 | Hoffman et al. |
| 6,746,894 B2 | 6/2004 | Yin et al. |
| 6,747,361 B2 | 6/2004 | Ichinose |
| 6,762,488 B2 | 7/2004 | Maeda et al. |
| 6,777,799 B2 | 8/2004 | Kikuma et al. |
| 6,777,819 B2 | 8/2004 | Huang |
| 6,787,915 B2 | 9/2004 | Uchida et al. |
| 6,787,916 B2 | 9/2004 | Halahan |
| 6,794,741 B1 | 9/2004 | Lin et al. |
| 6,794,749 B2 | 9/2004 | Akram |
| 6,818,980 B1 | 11/2004 | Pedron, Jr. |
| 6,828,665 B2 | 12/2004 | Pu et al. |
| 6,835,598 B2 | 12/2004 | Baek et al. |
| 6,838,761 B2 | 1/2005 | Karnezos |
| 6,847,105 B2 | 1/2005 | Koopmans |
| 6,861,288 B2 | 3/2005 | Shim et al. |
| 6,864,566 B2 | 3/2005 | Choi, III |
| 6,882,057 B2 | 4/2005 | Hsu |
| 6,890,798 B2 | 5/2005 | McMahon |
| 6,900,528 B2 | 5/2005 | Mess et al. |
| 6,906,415 B2 | 6/2005 | Jiang et al. |
| 6,906,416 B2 | 6/2005 | Karnezos |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,101,731 B2 | 9/2006 | Karnezos |
| 7,115,990 B2 * | 10/2006 | Kinsman .................. 257/737 |
| 7,119,427 B2 * | 10/2006 | Kim ..................... 257/686 |
| 2002/0096755 A1 | 7/2002 | Fukui et al. |
| 2002/0130404 A1 | 9/2002 | Ushijima et al. |
| 2003/0113952 A1 | 6/2003 | Sembasivam et al. |
| 2003/0153134 A1 | 8/2003 | Kawata et al. |
| 2004/0016939 A1 | 1/2004 | Akiba et al. |
| 2004/0061213 A1 | 4/2004 | Karnezos |
| 2004/0166605 A1 * | 8/2004 | Kuratomi et al. ........... 257/777 |
| 2004/0201087 A1 | 10/2004 | Lee |
| 2004/0212096 A1 | 10/2004 | Wang |
| 2006/0043556 A1 | 3/2006 | Su et al. |
| 2006/0065958 A1 * | 3/2006 | Tsao et al. .................. 257/678 |
| 2006/0138631 A1 | 6/2006 | Tao et al. |
| 2006/0189033 A1 | 8/2006 | Kim |
| 2006/0197209 A1 | 9/2006 | Choi et al. |

FOREIGN PATENT DOCUMENTS

| | | |
|---|---|---|
| EP | 0 652 630 A2 | 5/1995 |
| JP | 05152505 A | 6/1993 |
| JP | 2001223326 A | 8/2001 |
| KR | 20010688614 A | 7/2001 |
| KR | 2004085348 A | 10/2004 |
| WO | WO 98/50954 A1 | 11/1998 |
| WO | WO 02/084716 A2 | 10/2002 |
| WO | WO 03/032370 A2 | 4/2003 |

OTHER PUBLICATIONS

International Search Report and Written Opinion for corresponding International Applicaton No. PCT/US06/16143 dated Apr. 27, 2007.
Kim, J. and Boruch, J., "Enabling a Microelectronic World™",
AMKOR Technology, Inc. 2002 Annual Report, retrieved from Internet:<URL:http://media.corporate-ir.net/media_files/irol/11/115640/2002AnnualReport.pdf.

* cited by examiner

SEMICONDUCTOR STACKED PACKAGE ASSEMBLY HAVING EXPOSED SUBSTRATE SURFACES ON UPPER AND LOWER SIDES

CROSS REFERENCE TO RELATED APPLICATIONS

This application is a Continuation-in-Part of U.S. application Ser. No. 11/306,628, filed Jan. 4, 2006, which claims priority from U.S. Provisional Application No. 60/667,277, filed Mar. 31, 2005, both titled "Encapsulant cavity integrated circuit package system", and both of which are assigned to STATS ChipPAC Ltd. This application also claims priority from U.S. Provisional Application No. 60/692,182, filed Jun. 20, 2005, titled "Semiconductor stacked package assembly having exposed substrate surfaces on upper and lower sides".

This application contains subject matter related to U.S. application Ser. No. 11/306,627; U.S. application Ser. No. 11/326,211; and U.S. application Ser. No. 11/326,206, each of which was filed Jan. 4, 2006, and all of which are assigned to STATS ChipPAC Ltd.

This application is related to U.S. application Ser. No. 11/397,027, by Marcos Karnezos et al., titled "Semiconductor assembly including chip scale package and second substrate and having exposed substrate surfaces on upper and lower sides"; and U.S. application Ser. No. 11/394,635, by Marcos Karnezos et al., titled "Semiconductor package including second substrate and having exposed substrate on upper and lower sides"; both filed Mar. 31, 2006, and both assigned to STATSChipPAC Ltd.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. Mounting space may be limited, or at a premium, in devices such as in pagers, portable phones, and personal computers, among other products, and a large package footprint (x-y dimension) is undesirable. This has driven the industry to increase integration on the individual semiconductor chips, and also to implement integration on the "z-axis," that is, by stacking chips or by stacking die packages to form a stacked package assembly (stacked multi-package module).

Stacked package assemblies are employed in applications in which there is a need to provide a high degree of functional integration in an assembly having a minimal footprint and thickness. Portable telecommunications devices such as cellular telephones are an example of such applications, particularly where the telecommunications device includes, for example, capabilities for capture and display or play of images, audio or video.

Examples of functions that may desirably be integrated include devices for: various processes, including digital signal (DSP), ASIC, graphics (GPU); various memories, including Flash (NAND), Flash (NOR), SRAM, DRAM, MRAM; image and video capture, including optical sensor with memory; micro-electro-mechanical systems (MEMS) with processor and memory.

The z-interconnect between packages in a stacked package assembly is a critical technology from the standpoint of manufacturability, design flexibility and cost. Stacked package assemblies integrate chips and packages by stacking and electrically interconnecting them in the z-direction using wire bonds, or solder balls, or flip chip interconnection.

Stacked packages can provide numerous advantages. Particularly, each die or more than one die can be packaged in a respective package in the stack using the most efficient first level interconnect technology for the chip type and configuration, such as wire bonding or flip chip, to maximize performance and minimize cost.

It is desirable to be able to electrically test the stacked components (die or packages), so that the component can be rejected unless it shows satisfactory performance, before the packages are stacked. This permits maximizing the yield of the final stacked package assembly. To realize this advantage in practice, the packages must be configured to be testable using established test infrastructure. Generally, testing packaged die is preferable to testing individual die, as testing individual die can result in damage to interconnection pads on the die.

Often, the manufacturer of a product (particularly for example where the product is a portable communications device such as a cellular phone) determines the dimensions of a space in which the assembly must fit. That, is the manufacturer will demand that an assembly having specified functionalities have an overall footprint (length and width) and thickness within particular specifications. Presented with such limitations, the designer must, within cost limitations, be able to select packages and a stacking design and process that meet the demands for functionality within the limitations of thickness and footprint.

Accordingly, it is desirable to choose a multi-package stack structure and stacking process that provides design flexibility for the function designer. Particularly, for example, the designer should have flexibility, without having to redesign the structure or the process: to choose packages or chips from any of a variety of available vendors, to minimize component cost; to make changes in chip or package types within the assembly, to avoid having to re-qualify a changed assembly; and to complete the assembly stacking process at the final product stage on the surface mount assembly floor, to enable product configurations demanded by the market in the shortest practical time-to-market.

Meeting rapidly changing market demands can present challenges. For example, the general timeframe for designing a consumer device such as a cellular phone is typically longer than the timeframe for market shifts. A perception may develop in the industry that a particular functionality is desirable in a consumer device (e.g., web browsing functionality in a cellular phone), and designers may build that functionality into the assemblies; then within a short time it may become evident that the demand in the marketplace is not as had been perceived, and it may be desirable to remove that functionality or to present it in the marketplace as an option. Accordingly, it is desirable to be able to configure the device "on the fly", that is, to add or remove functionalities in a device without having to redesign the entire assembly.

It is desirable also to be able to stack off-the-shelf packaged chips, such as for example memory (Flash, SRAM, DRAM), over other packages in the assembly, using surface mount assembly methods employed in the industry for assembling products such as mobile communications devices (e.g., cellular phones) and computers. The type of memory for a product, in particular, can be different for different functionalities; for instance, if image capture functionality is desired in a cellular phone, a fast memory (DRAM) may be required.

The packages employed in stacked package assemblies and the manufacturing processes must be configured to enable both the physical stacking of the packages and the formation of electrical interconnections between them, using a chosen process for a chosen structure.

Stacked multi-package assemblies generally fall into two categories, namely, so-called "Package-on-Package" (PoP) assemblies, and so-called "Package-in-Package" (PiP) assemblies.

Examples of 2-stack PoP multi-package modules are shown for example in copending U.S. application Ser. No. 10/681,572, filed Oct. 8, 2003. In one example a first package (referred to as the "bottom" package) is similar to a standard BGA, having a die affixed to and electrically connected with the die attach side (the "upper" side) of a BGA substrate, and being cavity molded to provide a mold cap covering the die and electrical connections but leaving a marginal area of the die attach side of the substrate exposed. The side of the bottom package substrate opposite the die attach side (the "lower" side, which may be referred to as the "land" side) is provided with solder balls for second level interconnection of the module with underlying circuitry such as, for example, a motherboard. A second package (referred to as the "top" package) is stacked on the bottom package and is also similar to a standard BGA, except that the solder balls provided on the land side of the top package are arranged at the periphery of the top package substrate, so that they rest upon interconnection sites at the exposed marginal area of the die attach side of the bottom package. When the peripherally arranged balls are contacted with and then reflowed onto the peripherally located interconnect sites at the bottom package, they effect the z-interconnection without interference with the mold cap of the bottom BGA. The top package die and electrical connections are also encapsulated.

The type of z-interconnect employed in the PoP module requires that the top and bottom package substrates be designed with matching pads for the z-interconnect balls. If one of the packages is exchanged for one in which the substrate has a different pad arrangement (different size or different design), then the substrate for the other package must be reconfigured accordingly. This leads to increased cost for manufacture of the multi-package module. In the PoP configuration the distance between the top and bottom packages must be at least as great as the encapsulation height of the bottom package, which may be 0.25 mm or more, and typically is in a range between 0.5 mm and 1.5 mm, depending upon the number of die and depending upon whether the die-to-substrate electrical connection is by flip chip or by wire bonds. For example, for a single wire bonded die in the bottom package a moldcap of 300 um can typically accommodate a 75 um thick die. The z-interconnect solder balls must accordingly be of a sufficiently large diameter that when they are reflowed they make good contact with the bonding pads of the bottom BGA, without contact between the land side of the top package substrate and the upper surface of the bottom package mold cap; that is, the solder ball diameter must be greater than the encapsulation height by an amount that allows for solder ball collapse during reflow, plus a tolerance for noncoplanarities between balls and substrate. A typical design difference (additional clearance) between collapsed ball height and bottom mold cap height is about 25 um. For a moldcap having a thickness about 300 um, for example, z-interconnect solder balls greater than 300 um must be employed. A larger ball diameter dictates a larger ball pitch (typically about 0.65 mm pitch for 300 um balls, for example). That in turn limits the number of balls that can be fitted in the available space in the periphery of the bottom package substrate. Furthermore the peripheral arrangement of the solder balls forces the bottom BGA to be significantly larger than the mold cap of a standard BGA. And the peripheral arrangement of the solder balls increases the overall package size (the size increases according to the number of ball rows and the ball pitch). In standard BGAs the body size can be as much as about 2-3 mm larger than the mold cap. Moreover, the top package in a PoP configuration must be made of comparable size to the bottom one even though it may contain a small chip with many fewer interconnects. Increasing package footprint, to provide greater area for ball attachment (additional rows of balls, for example), may exceed the size limits for the particular application, and in any event entails longer wire bond spans and greater substrate area, both of which increase the cost of these components. Increasing the numbers of interconnections between packages may require that the top package substrate have at least two metal layers (and often more than two) to facilitate the routing within the substrate electrical connections. It may in some applications be impractical in a PoP configuration to stack two die in the bottom package, as this causes the bottom mold cap to be even thicker, exacerbating the problems described above.

Examples of two-stack PiP modules, having z-interconnection by wire bonds between the upward-facing sides of the top and bottom package substrates, are disclosed for example in copending U.S. application Ser. No. 10/632,549, filed Aug. 2, 2003, and copending U.S. application Ser. No. 10/681,572, filed Oct. 8, 2003. In the PiP configuration, the top package may be either oriented in the same direction as the bottom package (that is, with the die attach sides of both package substrates facing the same direction); or the top package may be inverted with respect to the bottom package (that is, with the die attach sides of the respective package substrates facing one another). Second-level interconnect solder balls are provided on the land side of the bottom package substrate for connection of the module with underlying circuitry such as, for example, a motherboard. In configurations where the top package is inverted, the z-interconnection wire bonds connect wire bond sites at the land side of the top substrate with peripherally arranged wire bond sites on the die attach side of the bottom package substrate. Where the top and bottom packages are oriented the same way, the z-interconnection wire bonds connect peripherally arranged wire bond sites at the die attach side of the top substrate with peripherally arranged wire bond sites at the die attach side of the bottom package substrate. In both configurations, the top package must be smaller (narrower and/or shorter by at least 0.5 mm on each margin that has z-interconnections) than the bottom package to accommodate the wire bond process.

The PoP module or PiP module is completed by overmolding, to entirely cover the top package and the wire bond interconnects between the packages. Once the module has been overmolded, no further integration can be made. That is, the designer has no flexibility to reconfigure the assembly at the product assembly level (that is, at the surface mount assembly floor); and the original equipment manufacturer cannot mix-and-match various packages from various suppliers to reduce costs.

SUMMARY

This invention is directed to stacked package assemblies, having first and second stacked packages. Each package includes at least one die affixed to, and electrically interconnected with, a die attach side of the package substrate. The side of each substrate opposite the die attach side may be referred to as the "land" side of the substrate. One package is inverted in relation to the other; that is, the die attach sides of the package substrates face one another, and the "land" sides of the substrates face away from one another. Z-interconnection of the packages is by wire bonds connecting the first and second package substrates.

Generally according to the invention, the assembly is encapsulated in such a way that both the second package substrate (at one side of the assembly) and a portion of the first package substrate (at the opposite side of the assembly) are exposed, so that second level interconnection and interconnection with additional components may be made.

According to one aspect of the invention, the first package is a matrix molded and saw singulated chip scale package (CSP), and the second package is a land grid array package (LGA), which may be cavity molded. Z-interconnection between the stacked packages is by wire bonds between wire bond sites in a marginal area on the land side of the CSP and peripherally located wire bond sites in a marginal area on the die attach side of the LGA. In some embodiments there is no separate molding over the die on the LGA substrate. In some embodiments the LGA package is molded, and in such embodiments the LGA package mold cap covers the die and electrical connections but leaves unmolded the marginal area of the die attach side of the substrate. The LGA substrate is larger (i.e., wider or longer, or both wider and longer) than the CSP package substrate, to accommodate the span of the wire bonds. The assembly encapsulation covers the marginal area of the die attach side of the LGA substrate, and encloses the z-interconnection wire bonds and wire loops, the edges of the CSP, and the marginal area on the land side of the CSP. Accordingly, both the land side of the LGA substrate, and the area of the land side of the CSP substrate located within the marginal area, are left exposed.

In some embodiments the CSP is a stacked die CSP; in some embodiments the LGA is a stacked die LGA. In some embodiments the die in the CSP is interconnected with the CSP substrate by wire bonding; or, the die in the CSP is interconnected with the CSP substrate by flip chip interconnection. In some embodiments the die in the LGA is interconnected with the LGA substrate by wire bond interconnect; or, the die in the LGA is interconnected with the LGA substrate by flip chip interconnect.

In one general aspect of the invention the CSP side of the assembly is the second level interconnect side; that is, second level interconnection of the assembly to underlying circuitry (such as, for example, a motherboard) is by solder balls (or other means of electrical connection) at lands on the exposed area on the land side of the CSP substrate. The exposed land side of the LGA substrate is, accordingly, available for interconnection with additional components that may be stacked over the assembly. In further aspects, then, the invention features a stacked package assembly that has both an LGA package substrate exposed at one side of the assembly and a portion of a CSP package substrate exposed at the opposite side of the assembly, and that includes second level interconnection formed at the exposed portion of the CSP package substrate and interconnection with one or more additional components at the exposed LGA package substrate. In some embodiments the additional component includes one or more of: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the LGA package.

In another general aspect of the invention the LGA side of the assembly is the second level interconnect side; that is, second level interconnection of the assembly to underlying circuitry (such as, for example, a motherboard) is by solder balls (or other means of electrical connection) at lands on the exposed area on the land side of the LGA substrate. The exposed land side of the CSP substrate is, accordingly, available for interconnection with additional components that may be stacked over the assembly. In further aspects, then, the invention features a stacked package assembly that has both an LGA package substrate exposed at one side of the assembly and a portion of a CSP package substrate exposed at the opposite side of the assembly, and that includes second level interconnection formed at the exposed portion of the LGA package substrate and interconnection with one or more additional components at the exposed CSP package substrate. In some embodiments the additional component includes one or more of: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the LGA package.

According to another aspect of the invention, a method for making a stacked package assembly includes steps of: providing a cavity molded LGA package, preferably tested as "good" (usually in an array or a strip of cavity molded LGA packages); applying an adhesive onto the surface of the mold cap of the "good" LGA package; providing a singulated CSP, preferably tested as "good"; inverting the "good" CSP and placing the inverted CSP onto the adhesive on the LGA mold cap; curing the adhesive; performing a plasma clean; wire bonding to form z-interconnection between the die attach side of the LGA and the land side of the CSP; performing a plasma clean; performing a molding operation to enclose the die attach side of the LGA, the z-interconnection wire bonds and wire loops, the edges of the CSP, and the marginal area on the land side of the CSP, leaving exposed the land side of the LGA substrate and an area of the land side of the CSP substrate located within a marginal area; attaching second level interconnect solder balls to sites on the exposed area of the CSP substrate; and (where the LGA package was provided in a strip or array) saw singulating to complete a unit assembly.

In some embodiments the method further includes affixing and electrically connecting an additional component at the exposed land side of the LGA substrate. An additional component or components can be mounted upon the assembly as a further step in the manufacture of the stacked package assembly; or, an additional component or components can be mounted upon the assembly at the final product assembly floor.

According to another aspect of the invention, a method for making a stacked package assembly includes steps of: providing a cavity molded LGA package, preferably tested as "good" (usually in an array or a strip of cavity molded LGA packages); applying an adhesive onto the surface of the mold cap of the "good" LGA package; providing a singulated CSP, preferably tested as "good"; inverting the "good" CSP and placing the inverted CSP onto the adhesive on the LGA mold cap; curing the adhesive; performing a plasma clean; wire bonding to form z-interconnection between the die attach side of the LGA and the land side of the CSP; performing a plasma clean; performing a molding operation to enclose the die attach side of the LGA, the z-interconnection wire bonds and wire loops, the edges of the CSP, and the marginal area on the land side of the CSP, leaving exposed the land side of the LGA substrate and an area of the land side of the CSP substrate located within a marginal area; attaching second level interconnect solder balls to sites on the exposed land side of the LGA substrate; and (where the LGA package was provided in a strip or array) saw singulating to complete a unit assembly.

In some embodiments the method further includes affixing and electrically connecting an additional component at the exposed area of the CSP substrate. An additional component or components can be mounted upon the assembly as a further step in the manufacture of the stacked package assembly; or, an additional component or components can be mounted upon the assembly at the final product assembly floor.

According to another aspect of the invention, a method for making a stacked package assembly includes steps of: providing an LGA substrate; mounting and electrically connecting a die onto a die attach side of the LGA substrate (usually in an array or a strip of LGA substrates; applying an adhesive onto the die on the LGA substrate; providing a singulated CSP, preferably tested as "good"; inverting the "good" CSP and placing the inverted CSP onto the adhesive on the die on the LGA substrate; curing the adhesive; performing a plasma clean; wire bonding to form z-interconnection between the die attach side of the LGA substrate and the land side of the CSP; performing a plasma clean; performing a molding operation to enclose the die attach side of the LGA, the z-interconnection wire bonds and wire loops, the edges of the CSP, and the marginal area on the land side of the CSP, leaving exposed the land side of the LGA substrate and an area of the land side of the CSP substrate located within a marginal area; attaching second level interconnect solder balls to sites on the exposed land side of the LGA substrate; and (where the LGA package was provided in a strip or array) saw singulating to complete a unit assembly. In embodiments where the die on the LGA substrate is mounted onto the LGA substrate in a flip chip manner with the active side facing the die attach side of the LGA substrate and the backside of the die facing away from the LGA substrate, the adhesive can be applied directly onto the backside of the die. In embodiments where the die on the LGA substrate is mounted with the active side of the die facing away from the LGA substrate and where the electrical connection of the die with the LGA substrate is made by wire bonds, the method includes mounting a spacer on the adhesive on the active side of the die, and applying an additional adhesive onto the spacer, so that the inverted CSP is placed onto the additional adhesive over the spacer; the spacer provides a standoff between the die and the CSP, so that the CSP does not impact the wire loops.

In some embodiments the method further includes affixing and electrically connecting an additional component at the exposed area of the CSP substrate. An additional component or components can be mounted upon the assembly as a further step in the manufacture of the stacked package assembly; or, an additional component or components can be mounted upon the assembly at the final product assembly floor.

In the stacked package assembly according to the invention the second package in the assembly stack can include any of a variety of LGA packages; the assembly can include wire bonded and/or flip chip packages; the assembly can include a thermal enhancement feature enabled by one or more heat spreaders in or on the assembly; the assembly can include one or more BGA and/or LGA having more than one die in the package stacked or side by side; the assembly can include electromagnetic shield for one or more of the packages; and the assembly can include any substrate, laminate or build-up or flexible or ceramic, provided that the z-interconnect pads are made available for bonding on a peripheral area of the packages.

The invention provides for excellent manufacturability, high design flexibility, and low cost to produce a stacked package module having a low profile and a small footprint.

The CSPs and LGAs are standard in the industry, providing the lowest cost and the widest availability. This provides significant flexibility in selecting the packages to be stacked and, therefore, in the kinds of functions that can be integrated into the assembly.

A typical single wire-bonded die CSP thickness is 0.8 mm and LGA thickness is 0.36 mm. The stacking of an inverted LGA on top of a CSP according to the invention can be completed using an adhesive having a finished thickness in the range 10-50 microns. This structure provides for the same or lower profile stacked package assembly compared to PoP. The footprint of the assembly according to the invention is determined by the maximum chip size of the stack. A typical minimum footprint for the LGA is 1.7 mm larger than the die size. The wire bond z-interconnect generally requires that the bottom CSP be smaller than the LGA, by about 0.5 mm to 1.0 mm, to accommodate the wires without shorting to the substrate metal edges. If the selected bottom CSP package is significantly smaller than the top LGA package, wire bonding can accommodate size differences at least up to 8 mm or more. For a given selected CSP, accordingly, this allows for selection of a top LGA having a significantly larger footprint than the CSP. This provides significant flexibility for the designer.

Stacked package assemblies according to the invention can be used for building computers, telecommunications equipment, and consumer and industrial electronics devices.

DETAILED DESCRIPTION

Figure 1:
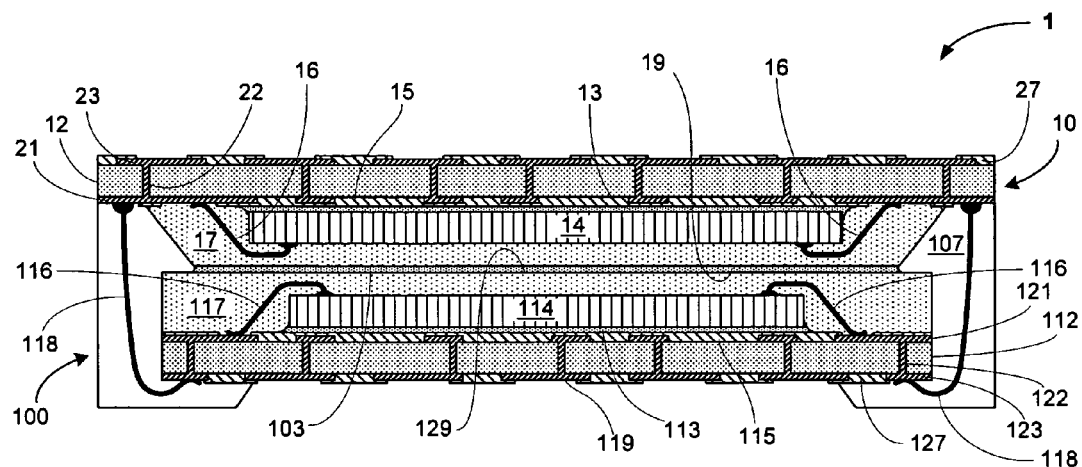
FIG. 1 is a diagrammatic sketch in a sectional view thru an embodiment of a stacked package assembly according to an aspect of the invention.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly relabeled, although they are all readily identifiable in all the FIGS.

At some points herein, terms of relative orientation, such as "horizontal", "vertical", "on", "over", "under", "above", "below", "top", "bottom", "upper", "lower", and the like, may be used with reference to the relative orientation of features as shown in the drawings. As will be appreciated, the various assemblies according to the invention may in use or during processing be held in any orientation.

All patents and patent applications referred to herein, above or below, are incorporated by reference.

Turning now to FIG. 1, there is shown in a diagrammatic sectional view generally at 1 an embodiment of a stacked package assembly, including stacked first ("bottom" in FIG. 1) and second ("top" in FIG. 1) packages, in which the second package is inverted, and the stacked packages are interconnected by wire bonding, according to an aspect of the invention. In the embodiment shown in FIG. 1, the first package 100 is a conventional chip scale package ("CSP"). Accordingly, in this embodiment the first package 100 includes a die 114 attached onto a first package substrate 112 having at least one metal layer (which may be referred to as in "interposer"). Any of various substrate types may be used, including for example: a laminate with 2-6 metal layers, or a build up substrate with 4-8 metal layers, or a flexible polyimide tape with 1-2 metal layers, or a ceramic multi-layer substrate. The first package substrate 112 shown by way of example in FIG. 1 has two metal layers 121, 123, each patterned to provide appropriate circuitry and connected by way of vias 122. The die is conventionally attached to a surface of the substrate using an adhesive, typically referred to as the die attach epoxy, shown at 113 in FIG. 1 and, in the configuration in FIG. 1, the side of the substrate onto which the die is attached (the "die attach" side) may be referred to as the "upper" side, and the metal layer on that side may be referred to as the "upper" metal layer, although the die attach side need not have any particular orientation in use.

In the first CSP package of FIG. 1 the die is wire bonded onto wire bond sites on the upper metal layer of the substrate to establish electrical connections. The die 114 and the wire bonds 116 are encapsulated, by matrix molding and saw singulation, with a molding compound 117 that provides protection from ambient and from mechanical stress to facilitate handling operations, and provides a first package upper surface 129 onto which a second package can be stacked. Bonding pads 119 are provided on the lower metal layer 123 of the substrate 112, for second level interconnection of the assembly to the underlying circuitry of, for example, a motherboard (not shown in the FIGS.). Solder masks 115, 127 are patterned over the metal layers 121, 123 to expose the underlying metal at bonding sites for electrical connection, for example the wire bond sites and bonding pads for bonding the wire bonds 116 and solder balls 118.

In the embodiment shown in FIG. 1, the second package 10 is a cavity molded and punch singulated land grid array ("LGA") package. Particularly, in this example, the second package 10 includes a die 14 attached onto a second package substrate 12 having at least one metal layer. Any of various substrate types may be used; the second package substrate 12 shown by way of example in FIG. 1 has two metal layers 21, 23, each patterned to provide appropriate circuitry and connected by way of vias 22. The die is conventionally attached to a die attach surface of the substrate using an adhesive, typically referred to as the die attach epoxy, shown at 13 in FIG. 1. According to the invention, the second package is inverted in relation to the first package, that is to say, the second package is oriented so that the die attach side of the second package substrate faces toward the die attach side of the first package substrate, and the land side of the second package substrate faces away from the land side of the first package substrate. Because the second ("upper" in FIG. 1) (LGA) package is inverted in the assembly, so that it is relatively speaking upside-down or downside-up, the die attach side of the second (LGA) package, which would customarily be termed the upper surface or upper side of the LGA substrate, may be referred to in the text herein as the downward or downward facing side of the inverted LGA; and the opposite side—or land side—of the LGA substrate, which would customarily be termed the lower surface or lower side, may be referred to in the text herein as the upward or upward facing surface.

In the configuration in FIG. 1, for example, the surface of the second package substrate onto which the die is attached (the die attach side) faces toward the first package, and, accordingly the "upper" surface of the second package, to which the die is affixed, is here referred to as the "downward facing" surface of the second package substrate, it being appreciated again that the assembly need not have any particular orientation in use. That is to say, once the second package has been inverted in the assembly according to the invention, for purposes of description the surface of the second package substrate having the "upper" metal layer 21 is said to be "downward facing", and the surface of the second package substrate having the "lower" metal layer 23 is said to be "upward facing".

In the second (LGA) package 10 in the embodiment of FIG. 1 the die is wire bonded onto wire bond sites on the upper metal layer 21 of the LGA package substrate to establish electrical connections. The die 14 and the wire bonds 16 are encapsulated with a molding compound forming a mold cap 17 that provides protection from ambient and from mechanical stress to facilitate handling operations, and the mold cap has an upper surface 19. The second package 10 is inverted (so that the surface 19 is "downward facing"), and is stacked over the first package 100 and affixed there using an adhesive 13. Solder masks 15, 27 are patterned over the metal layers 21, 23 to expose the underlying metal at bonding sites for electrical connection, for example the wire bond sites for bonding the wire bonds 16.

The z-interconnect between the stacked inverted second package 10 and first package 100 is made by way of wire bonds 118 connecting traces on the downward facing metal layer (the "upper" metal layer 21) of the second package substrate with traces on the lower metal layer 123 of the first package substrate. At one end each wire bond 118 is electrically connected to downward facing surfaces of pads on the upper metal layer 21 of the second package substrate 12, and at the other end each wire bond is connected to lower surfaces of pads on the lower metal layer 123 of the first package substrate 112. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 1 as having been made by forming a bead or bump on the upper surface of a pad on the lower metal layer of the inverted second substrate, and then drawing the wire toward, and fusing it onto, a pad on the lower metal layer of the first substrate. As will be appreciated, the wire bonds can be made in the inverse direction, that is, by forming a bead or bump on the lower surface of a pad on the lower metal layer of the first substrate, and then drawing the wire toward, and fusing it onto, a pad on the upper metal layer of the second substrate. As will be appreciated, selection of a wire bonding strategy for the package-to-package z-interconnection will be determined according to the geometric arrangements of the margins of the stacked substrates and of the bonding surfaces on them. Also, as will be appreciated, in conventional wire bonding equipment the wire bond capillary strikes downward onto upwardly oriented bond pads and, accordingly, the assembly will be inverted according to the invention for the wire bonding procedure at least.

As pointed out above, in embodiments as in FIG. 1, the second (LGA) package is cavity molded to provide a mold cap leaving an area at the periphery of the die attach side of the second package substrate on which the bond pads are exposed for the wire bonds 118, and (typically later) punch- or saw-singulated.

The first package, on the other hand, is matrix molded and saw singulated (to provide vertical walls for the molding, as shown in FIG. 1), so that the die attach side of the first package substrate is covered by the molding. Bond pads in the upper metal layer at the die attach side of the first package substrate are connected to the die by wire bonds, and the upper metal layer is connected to the lower metal layer at the land side of the first package substrate through vias to the die attach side of the substrate, and the lower metal layer at the land side of the bottom package substrate is patterned to provide peripherally arranged bond pads for connection with the z-interconnection wires 118.

The structure according to the invention allows for pre-testing of both the CSP and the LGA before assembly into the multi-package module, to permit rejection of nonconforming packages prior to assembly, and thereby to assure high final module test yields.

In the stacked package embodiment of FIG. 1, the z-interconnect pads on the respective package substrates are arranged on metal layers near the margins of the package substrates. The location and order of the z-interconnect pads are generally arranged so that the z-interconnect pads on the top package substrate approximately overlie the corresponding z-interconnect pads on the bottom package when the packages are stacked. Conveniently, the second package 10 has a larger substrate footprint than that of the first package 100, to allow clearance for the wire bonds without electrical shorting to the edges of the metal layers of the substrates.

Figure 3:
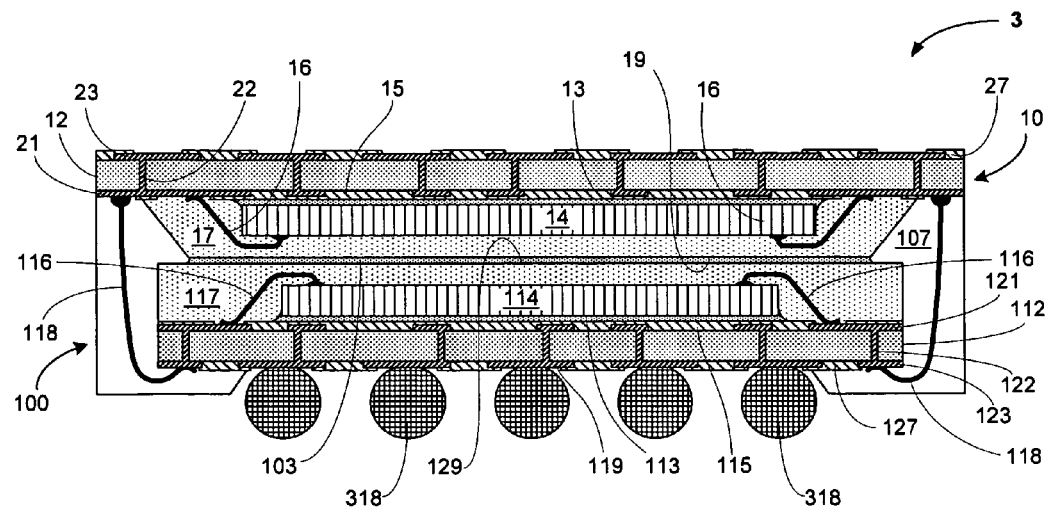
FIG. 3 is a diagrammatic sketch in a sectional view thru an embodiment of a stacked package assembly according to another aspect of the invention.

Once the z-interconnect wire bonds have been formed connecting the stacked first and second packages, an assembly encapsulation 107 is formed, to enclose and protect the z-interconnect wire bonds and to provide mechanical integrity to the completed module. The assembly encapsulation 107 covers the marginal area of the die attach side of the LGA substrate, and encloses the z-interconnection wire bonds and wire loops and the vertical walls and edges of the first (CSP) package, and covers the marginal area of the land side of the first (CSP) package substrate including the wire loops and the wire bond pads to which the wire bonds are connected. This leaves an area of the land side of the first package substrate exposed for second-level interconnection. Stated another way, a cavity is formed in the assembly encapsulation on the first package side, leaving an inboard area of the land side of the second package substrate exposed (unencapsulated). Referring to FIG. 3, solder balls 318 are reflowed onto bonding pads 119 on the lower metal layer of the substrate within the cavity in the encapsulation to provide interconnection to underlying circuitry of, for example, a motherboard (not shown in the FIGS.) of a final product, such as a computer. As described in further detail below, additional packages or die can be mounted upon and electrically connected with the land side of the second package substrate.

As shown by way of example in FIGS. 1 and 3, the module may itself be saw-singulated; alternatively, the module may be individually molded rather than saw-singulated.

As may be appreciated, either or both the first and second packages may have flip chip, rather than wire bonding, interconnection of the die to the respective package substrates.

Figure 2:
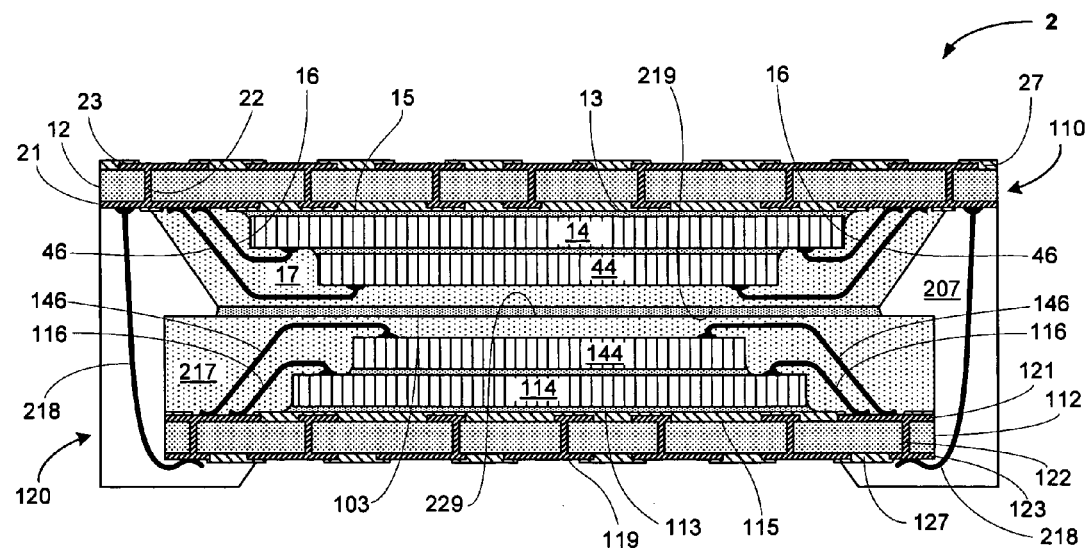
FIG. 2 is a diagrammatic sketch in a sectional view thru an embodiment of a stacked package assembly according to another aspect of the invention.

Either the first package or the second package, or both packages, may be a stacked die package. FIG. 2 shows, by way of example, a stacked package assembly 2 generally as in FIG. 1, except that in the example of FIG. 2 both the first package and the second package are stacked die packages, each having two wire bonded die. Referring now to FIG. 2, a first package 120 is a conventional two-die stacked die CSP. In package 120 a first die is 114 attached using an adhesive to the (upward facing in the FIG.) die attach side of substrate 112 and a second die 144 is attached using an adhesive to the (upward facing) die attach side of the first die 114. The first die 114 and the second die 144 are electrically connected by wire bonds 116, 146, respectively, to bond sites in the upper metal layer 121. The die 114, 144 and the wire bonds 116, 146 are encapsulated, by matrix molding and saw singulation, with a molding compound 217, that provides protection from ambient and from mechanical stress to facilitate handling operations, and provides a first package upper surface 229 onto which a second package can be stacked. In the example of FIG. 2, the second package 110 is a cavity molded and punch singulated two-die stacked die LGA. In the package 110 a first die 14 is attached using an adhesive to the (downward facing in the FIG.) die attach side of substrate 12 and a second die 44 is attached using an adhesive to the (downward facing) side of the first die 14. The first die 14 and the second die 44 are electrically connected by wire bonds 16, 46, respectively, to bond sites in the metal layer 21. The die 14, 44 and the wire bonds 16, 46 are encapsulated by cavity molding with a molding compound 17 that provides protection from ambient and from mechanical stress to facilitate handling operations, and provides a mold cap upper surface 219. In the stacked package assembly 2 the first and second packages 120, 110 are in inverted relation to each other, and one is affixed over the other using an adhesive 103 between the mated upper surfaces of their respective molding or mold caps. The z-interconnection wire bonds 218 are formed. Once the z-interconnect wire bonds have been formed connecting the stacked first and second packages, an assembly encapsulation 207 is formed, to enclose and protect the z-interconnect wire bonds and to provide mechanical integrity to the completed module. The assembly encapsulation 207 covers the marginal area of the die attach side of the LGA substrate, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the first (CSP) package substrate exposed for second-level interconnection. Solder balls are reflowed onto bonding pads 119 on the lower metal layer of the exposed first package substrate to provide interconnection to underlying circuitry of, for example, a motherboard (not shown in the FIGS.) of a final product, such as a computer.

In an alternative embodiment, the exposed side of the second package substrate provides for second-level interconnection. By way of example, the embodiment shown in FIG. 4 has second level interconnect solder balls 418 mounted onto pads 419 on the metal layer 23, for connection of the assembly to underlying circuitry such as a motherboard. In embodiments such as these, the exposed portion of the first package substrate is available for stacking additional components such as packages, die, or passive devices. In such embodiments, a greater area is available on the land side of the second package substrate for second-level interconnects, and on the die attach side for passive devices 29; on the other hand, the exposed portion of the first package substrate has a more limited area than the second package substrate, limiting the number of interconnections that can be made at the first package side. Moreover, the part of the assembly molding 107 that covers the marginal area of the land side of the land side of the first package substrate must be thick enough to accommodate the loop height of the wire bonds 118 (plus a tolerance). Typically the thickness of the molding at the wire loops is in the range about 50 um to about 200 um. Where reverse wire bonding is employed, so that an end of the wire loop is stitched onto the pads on the land side of the first package, the wire loop height in practice may be as little as about 35 um and, accordingly, a molding thickness over the marginal area of as little as about 100 um can be achieved in such embodiments. A greater mold height will be required where forward wire bonding is employed, as the wire loop height over a ball (or bump) as more usually about 100 um or greater using currently available wire bonding techniques forming wire having about 1 mil thickness.

This in effect raises a low wall around the exposed region of the first package substrate, and this can limit the dimensions and configuration of devices that may be stacked upon the land side of the first package substrate. Embodiments as shown for example in FIG. 3, in which the second level interconnection is made at the exposed region of the land side of the first package substrate, permit stacking of much larger additional components over the assembly, as shown in FIGS. 7B and 8B, for example.

Figure 4:
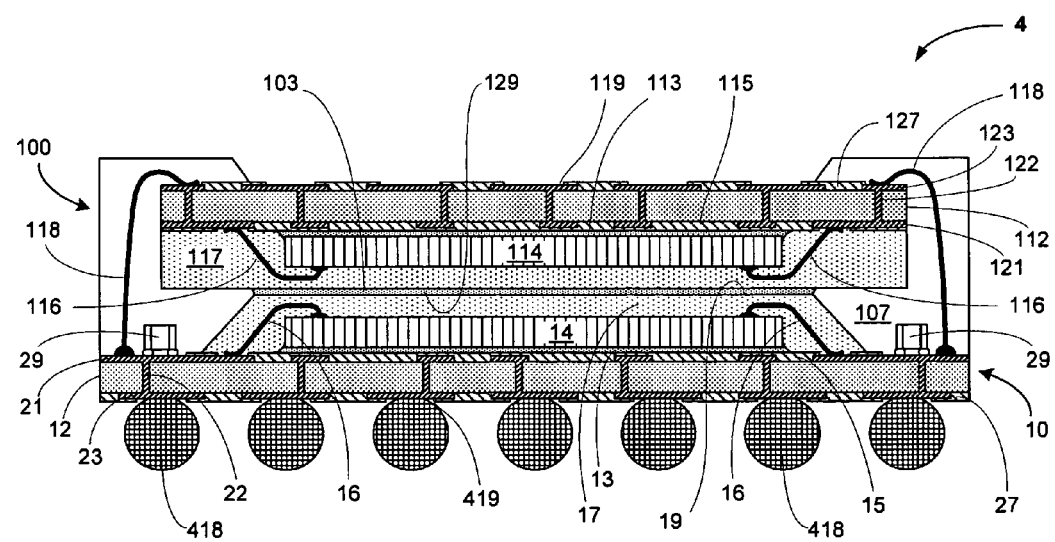
FIG. 4 is a diagrammatic sketch in a sectional view thru an embodiment of a stacked package assembly according to another aspect of the invention.
Figure 16:
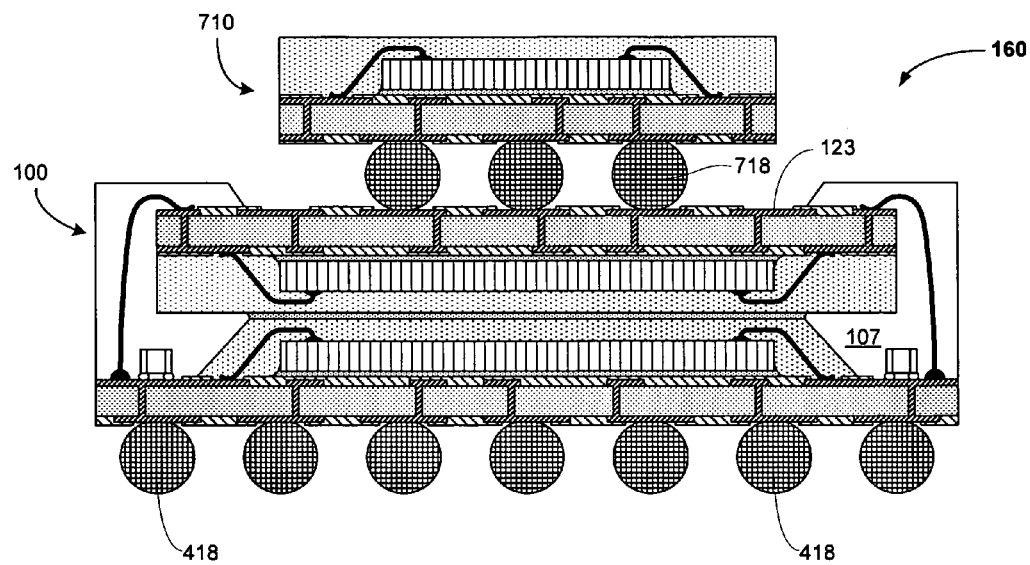
FIG. 16 is a diagrammatic sketch in a sectional view thru a stacked package assembly according to an embodiment of the invention, including a BGA stacked over an assembly according to an embodiment of the invention as shown in FIG. 4.
Figure 17:
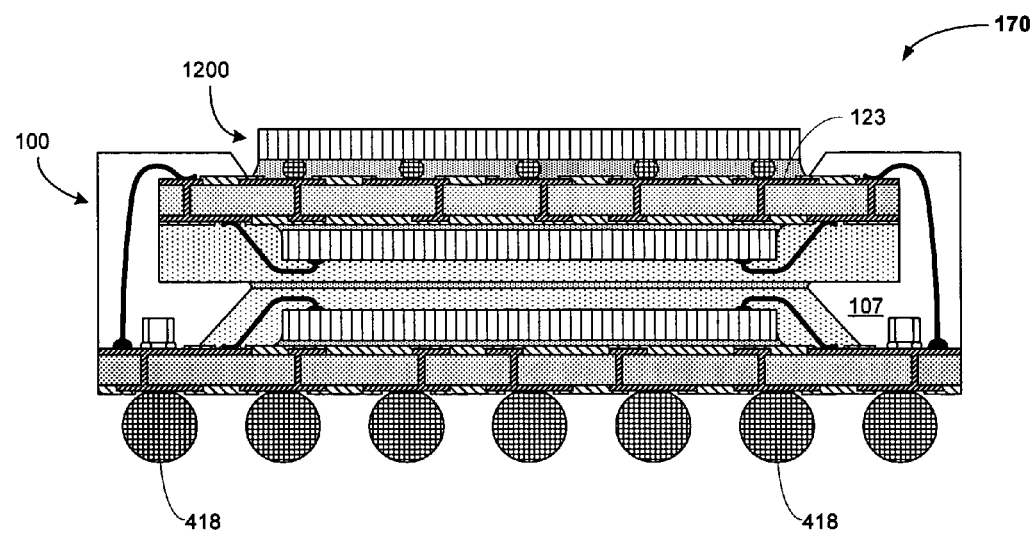
FIG. 17 is a diagrammatic sketch in a sectional view thru a stacked package assembly according to an embodiment of the invention, including a flip chip die mounted over an assembly according to an embodiment of the invention as shown in FIG. 4.

Embodiments as shown for example in FIG. 4, in which the second level interconnection is made at the land side of the second package substrate, are shown in FIGS. 16 and 17, for example. As described in further detail below, one or more additional components can be mounted upon and electrically connected with, the land side of the first package substrate within the cavity in the encapsulation.

Figure 5A:
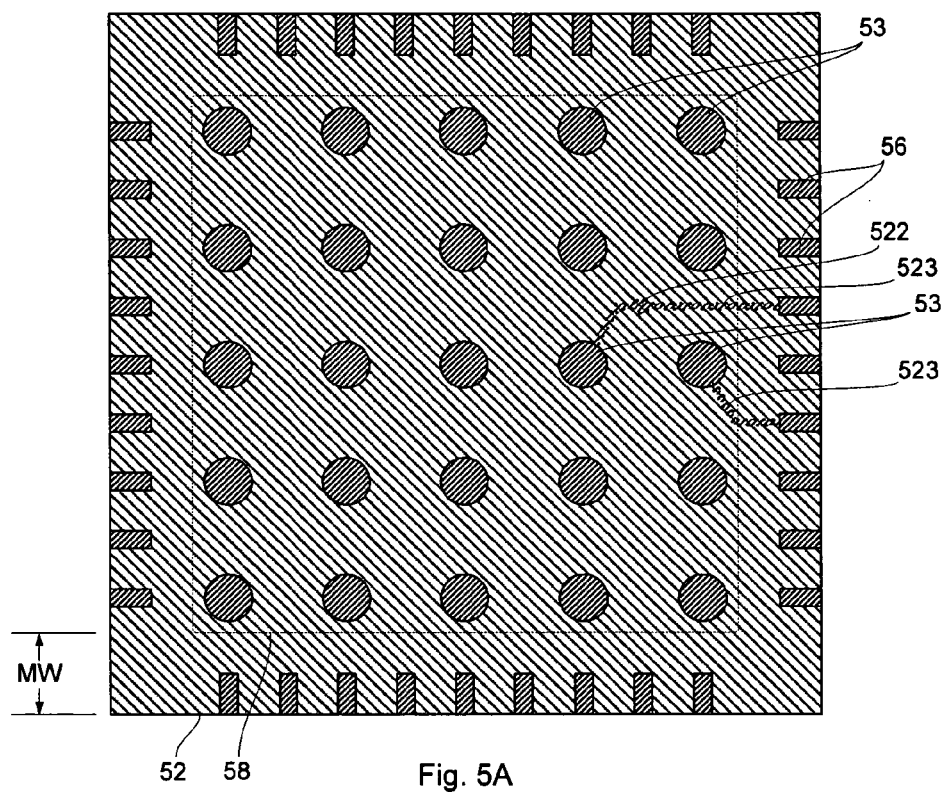
FIG. 5A is a diagrammatic sketch in a plan view showing the land side of a CSP substrate according to an embodiment of the invention in an arrangement suitable for use in an embodiment of the invention as shown in FIG. 3.
Figure 5B:
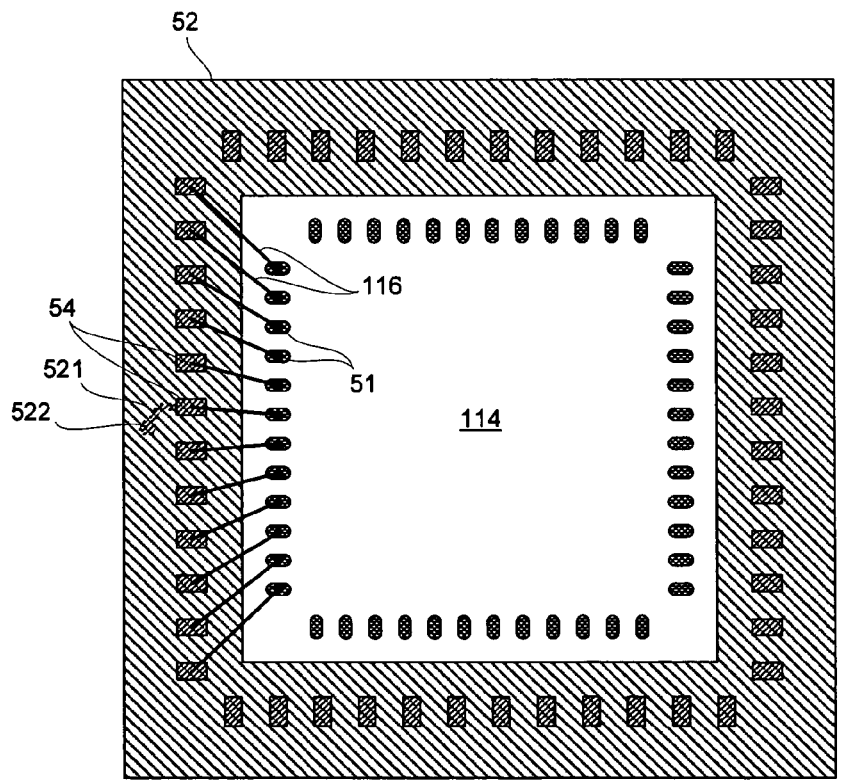
FIG. 5B is a diagrammatic sketch in a plan view showing the die attach side, with die attached, of a CSP substrate according to an embodiment of the invention in an arrangement suitable for use in an embodiment of the invention as shown in FIG. 3.

FIGS. 5A and 5B are diagrammatic sketches in plan view showing the land side and the die attach side, respectively, of a suitable first package substrate as illustrated at 112 in FIG. 1. Referring to FIG. 5A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 53) arrayed in a middle region of the substrate surface, and bond fingers (e.g., 56), arranged in a marginal area near the edge 52 of the substrate. Obscured by the solder mask are traces (e.g., 523) in the metal layer which variously connect the ball pads 53 and the bond fingers 56, and/or connect ball pads 53 with vias (e.g., 522) which electrically connect traces in the patterned metal layer at the land side of the substrate with traces in the patterned metal layer at the die attach side of the substrate.

As described above, the assembly encapsulation covers the bond pads 56 and the wire loops formed at the pads 56; the encapsulation is limited at the land side of the substrate to a marginal area, indicated in FIG. 5A by the broken line 58, so the region of the land side of the first package substrate bounded by the marginal encapsulation, that is, within the broken line 58, is left exposed following formation of the assembly molding. Accordingly, the ball pads 53 are available for z-level interconnection of the assembly to underlying circuitry (as illustrated for example in FIG. 3), or, in other embodiments, for attachment of additional devices (as illustrated for example in FIG. 4). The ball pads 53 are additionally available as test probe sites for testing the package prior to assembly, or for testing the package assembly, if desired, prior to mounting the second level interconnect solder balls or additional devices. The encapsulated marginal area has a width (MW in FIG. 5A) determined by the sum of the lengths of the bond fingers, the length of the trace to the bond finger, and the width of the saw street. Additionally, some mold flash may appear on the substrate surface at the inner edge of the margin (at the broken line 58 in FIG. 5A). Where the substrate is provided as one in a strip or array, some substrate material at the edge is lost to the saw width during saw singulation of the first package. Typically the bond finger length is about 250 um, the finger trace length is about 50 um, and an allowance for mold resin bleed can be about 500 um. The saw typically consumes about 50 um.

As a practical matter the number and arrangement of the ball pads 53 depend upon the nominal ball diameter, as the balls must not contact each other, or be too close together, when collapsed. Also as a practical matter the size and proximity of the ball pads 53 are limited by limits of resolution in fabricating the traces and, particularly, the solder mask openings. In a typical example the ball pads are generally circular with a diameter about 280 um, and are arranged in a square or rectangular array at a center-to-center distance about 500 um. (The distance between nearest edges of adjacent solder mask openings is typically not less than about 0.20 times the center-to-center distance.)

The die attach side of the first package substrate, with die attached, is illustrated in FIG. 5B. The die 114 is affixed, active side upward, onto the die attach side of the substrate. In this example, the die has four edges defining a square. Wire bond pads 51 are arranged in rows near the four edges of the die. As on the land side of the substrate, most of the surface of the die attach side is covered by a solder mask, except where sites on the metal layer are revealed by openings in the solder mask, including particularly rows (one row along each edge of the die, in this example) of bond fingers (e.g., 54). Wires 116 connect the die pads 51 with the bond fingers 54. Obscured by the solder mask are traces (e.g., 521) in the metal layer connecting bond fingers 54 to vias (e.g., 522) which electrically connect traces in the patterned metal layer at the die attach side of the substrate with traces in the patterned metal layer at the land side. Accordingly, the first package die is connected by way of the wires to traces in the metal layer on the die attach side of the first package substrate, and by way of vias to traces and to z-interconnect wire bond fingers in the metal layer on the land side. The z-interconnect wires connect the bond fingers on the land side of the first package substrate to bond fingers on the die attach side of the second package substrate.

Figure 6A:
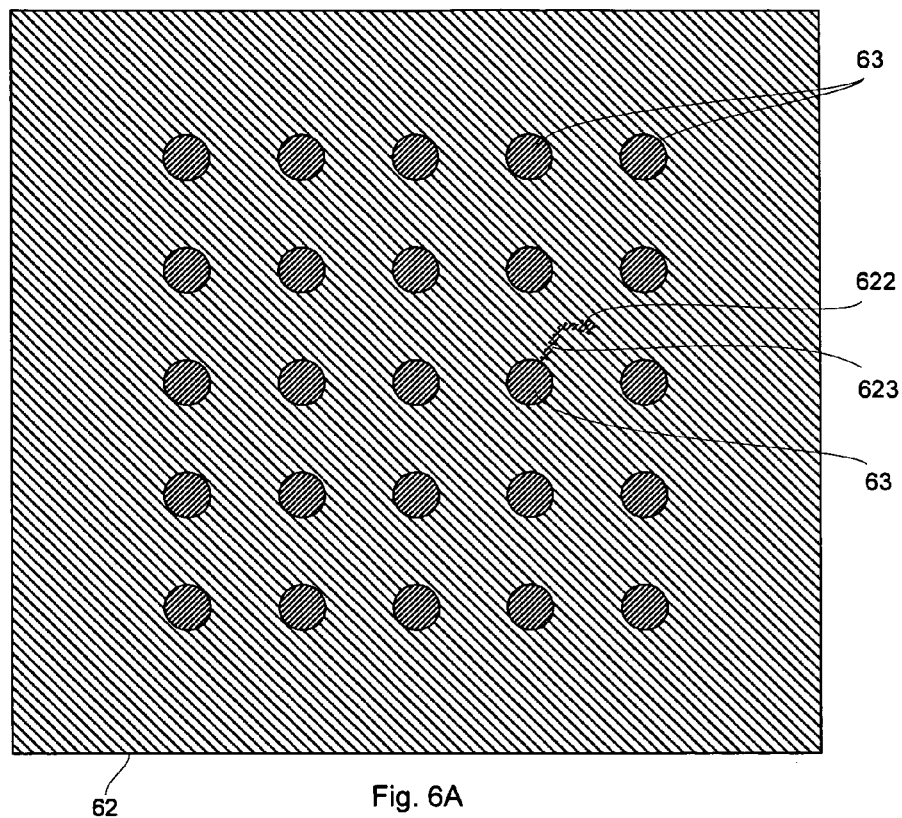
FIG. 6A is a diagrammatic sketch in a plan view showing the land side of a LGA substrate according to an embodiment of the invention in an arrangement suitable for use in an embodiment of the invention as shown in FIG. 3.
Figure 6B:
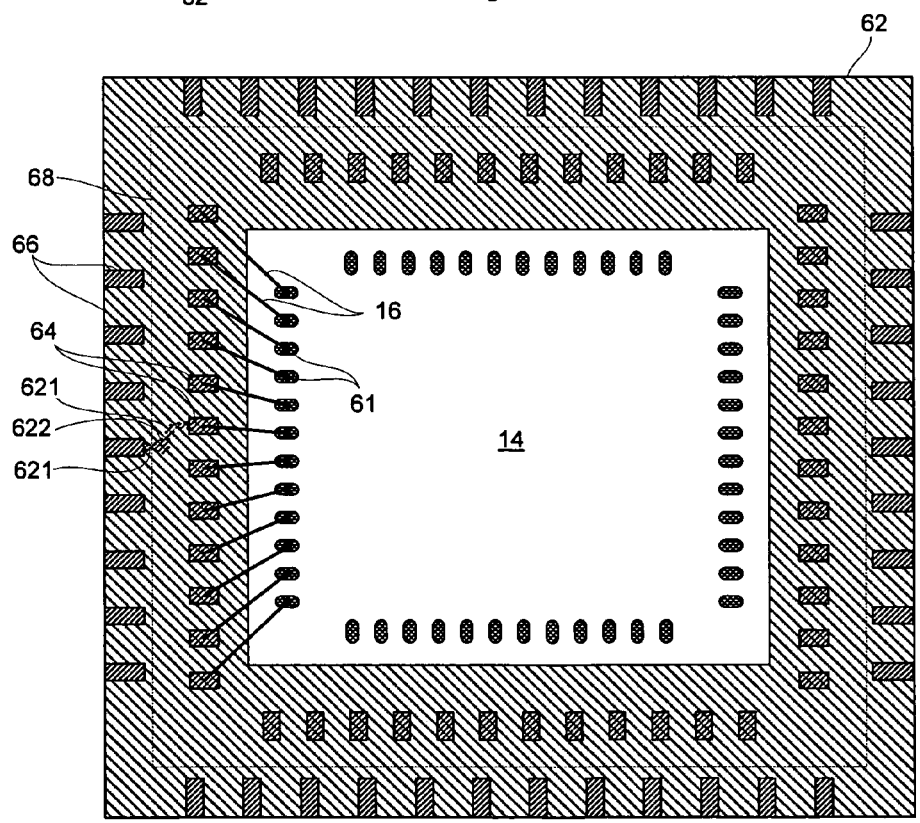
FIG. 6B is a diagrammatic sketch in a plan view showing the die attach side, with die attached, of a LGA substrate according to an embodiment of the invention in an arrangement suitable for use in an embodiment of the invention as shown in FIG. 3.

FIGS. 6A and 6B are diagrammatic sketches in plan view showing the land side and the die attach side, respectively, of a suitable second package substrate as illustrated at 12 in FIG. 1. Referring to FIG. 6A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 63) arrayed in a middle region of the substrate surface. Obscured by the solder mask are traces (e.g., 623) in the metal layer which connect the ball pads 63 to vias (e.g., 622) which electrically connect traces in the patterned metal layer at the land side of the substrate with traces in the patterned metal layer at the die attach side of the substrate.

As described above, land side of the second package substrate is left entirely exposed following assembly encapsulation. Accordingly, the view of the second package substrate in FIG. 6A is substantially a view of a surface of the assembly. Accordingly, the ball pads 63 are available for z-level interconnection of the assembly to underlying circuitry (as illustrated for example in FIG. 4) or, more preferably, for attachment of additional devices (as illustrated for example in FIG. 3). The ball pads 63 are additionally available as test probe sites for testing the package prior to assembly, and for testing the package assembly, if desired, prior to mounting the second level interconnect solder balls.

Optionally, and in some applications preferably, the ball attach pads on the upward-facing land side of the second package substrate may be employed to facilitate testing of the LGA using a conventional test socket. Such testing of the LGA can be carried out prior to attaching the top LGA package into the bottom package, to ensure that only top LGAs testing as "good" are stacked over the bottom CSP packages (which may also be tested and identified as "good"). Or, testing of the LGA can be carried out following inversion of the LGA and attachment as a top package, but prior to formation of the overall module molding, or prior to z-interconnect wire-bonding. Testing, facilitated according to the constructs of the invention, at any of various stages in manufacture, can significantly reduce the likelihood of further processing of components that do not meet specifications.

The die attach side of the second package substrate, with die attached, is illustrated in FIG. 6B. The die 14 is affixed, active side upward, onto the die attach side of the substrate. In this example, the die has four edges defining a rectangle. Wire bond pads (e.g., 61) are arranged in rows near the four edges of the die. As on the land side of the substrate, most of the surface of the die attach side is covered by a solder mask, except where sites on the metal layer are revealed by openings in the solder mask, including particularly rows (one row along each edge of the die, in this example) of die interconnect bond fingers (e.g., 64), and z-interconnect bond fingers (e.g., 66) arrange in a marginal area near the edge 62 of the substrate. Wires 116 connect the die pads 61 with the die interconnect bond fingers 64. Obscured by the solder mask are traces (e.g., 621) in the metal layer connecting bond fingers 64 to vias (e.g., 622) which electrically connect traces in the patterned metal layer at the die attach side of the substrate with traces in the patterned metal layer at the land side, and connecting die interconnect bond fingers 64 to z-interconnect bond fingers 66.

The second package z-interconnect pads (bond fingers) 66 are formed by patterning regions of the metal layer situated at the margin on the die attach side of the second package substrate 12. The margin extends beyond the footprint of the stacked CSP package, defined by the edge 52 of the CSP package substrate 112. The width of the margin can be less about 1 mm, and, in order to provide adequate clearance for the wire bonding the width of the margin may preferably be greater than about 0.2 mm. Nominally in some embodiments the margin is about 0.5 mm.

As noted above, the second package mold cap covers the die, the die interconnect wires, and the die interconnect bond fingers, leaving a marginal area near the periphery of the substrate, including the z-interconnect bond fingers, uncovered by package molding. Accordingly, the second package die is connected by way of the wires to traces in the metal layer on the die attach side of the first package substrate, and by way of vias to traces and to z-interconnect wire bond fingers in the metal layer on the land side. The z-interconnect wires connect the bond fingers on the die attach side of the second package substrate to bond fingers on the land side of the first package substrate. Similarly, both die are interconnected as appropriate by way of the traces, wires, and vias to the pads on the land sides of the substrates, where interconnection of the assembly is made to an underlying substrate (second level interconnection) and to additional devices stacked over the assembly.

As suggested in the FIGS., the second package substrate necessarily has a larger footprint than the first package substrate, to accommodate the z-interconnection between the package substrates. In the examples shown, z-interconnects are arranged along all four edges of the packages and, accordingly, the second package is both wider and longer than the first package. As may be appreciated, in some assemblies according to the invention, z-interconnection may be made between bond fingers on fewer than all four edges, as for example along only one edge, or along two opposite edges. In such embodiments (unless a larger die in the second substrate requires a larger footprint), the second package need be larger (longer or wider) than the first package only in one direction.

The first and second packages may have any of a variety of functionalities. For example, the CSP package can be a DSP, ASIC, GPU; and the LGA package can be a memory, such as Flash, DRAM, SRAM.

The processor chip in a flip chip bottom package according to this aspect of the invention can be, for example, an ASIC, or a GPU, or a CPU, often an ASIC; and the top package can be, for example, a processor chip or, for example, a memory package or an ASIC package. Where the top package is a memory package it can be a stacked die memory package. A shielded flip chip die-up bottom package can be particularly suitable for higher speed applications, particularly for RF frequency processing, as in mobile communications applications.

In still other configurations according to the invention, an additional package is attached to the assembly on an available (exposed) substrate surface.

In some embodiments the additional package is attached to the assembly on the exposed land side of the second package substrate. In such embodiments the assembly as shown for example in FIG. 1 or 2 can provide a useful platform upon which to stack components having additional functionalities, as shown for example in FIGS. 7A through 13. Because the second package substrate is fully exposed, it can accommodate any of a variety of component (die or package) configurations and sizes, and all that is required for compatibility of the assembly with the components is that the traces on the exposed second package substrate be suitably routed to accept the additional component.

Figure 7A:
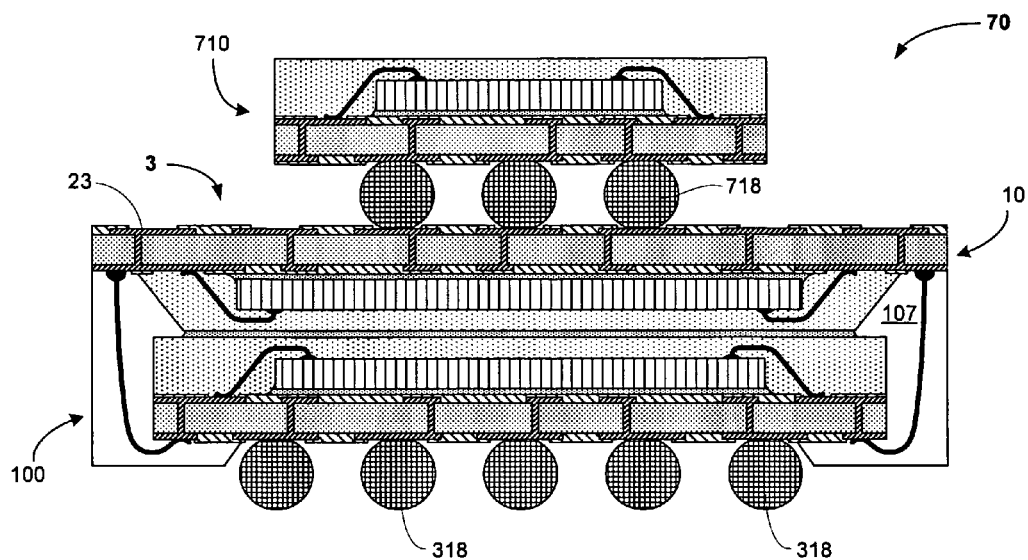
FIGS. 7A and 7B are diagrammatic sketches in a sectional view thru a stacked package assembly according to embodiments of the invention, each including a BGA stacked over an assembly according to an embodiment of the invention as shown in FIG. 3.
Figure 7B:
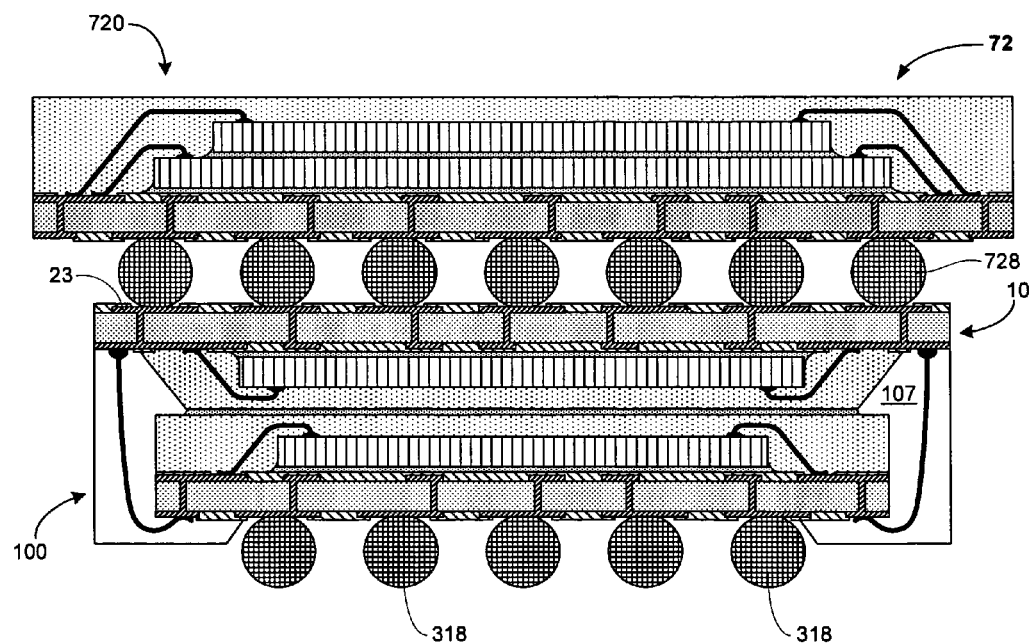

For example, as shown in FIGS. 7A and 7B a ball grid array (BGA) package can be mounted over an assembly constructed as described above with reference to FIG. 3. In FIG. 7A, a BGA package 710 having interconnect solder balls 718 is aligned with and mounted upon the land side of a second package 10 substrate, and the solder balls are reflowed onto ball pads in the metal layer 23 to form a module 70. Here the BGA footprint is smaller than that of the assembly; in the module 72 shown in FIG. 7B, the footprint of the BGA 720 is larger than that of the assembly, and the ball array has more interconnect solder balls, which accordingly occupy more ball pads on the second package 10 substrate. Also, in the example of FIG. 7B, the BGA is a stacked die package, while in FIG. 7A the BGA is a single die package.

Figure 8A:
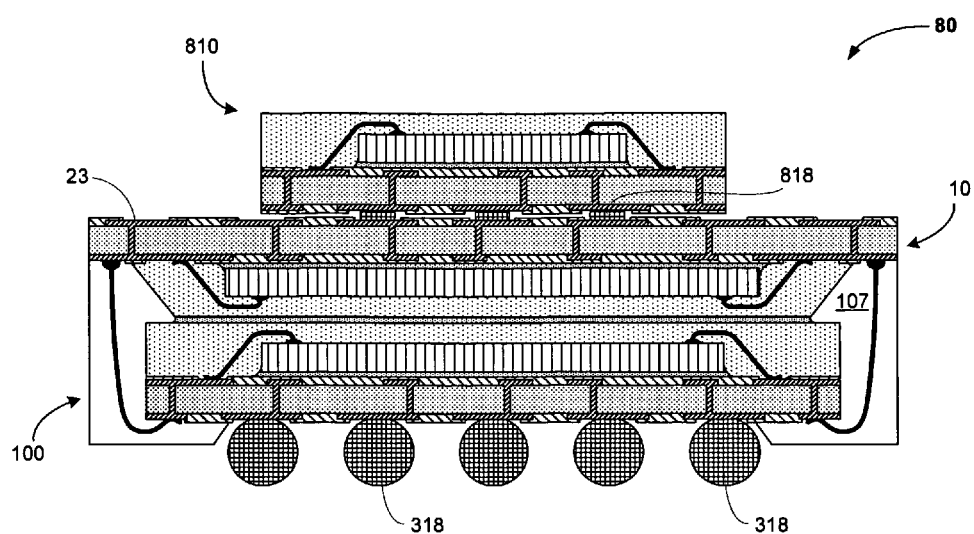
FIGS. 8A and 8B are diagrammatic sketches in a sectional view thru a stacked package assembly according to embodiments of the invention, each including a LGA stacked over an assembly according to an embodiment of the invention as shown in FIG. 3.
Figure 8B:
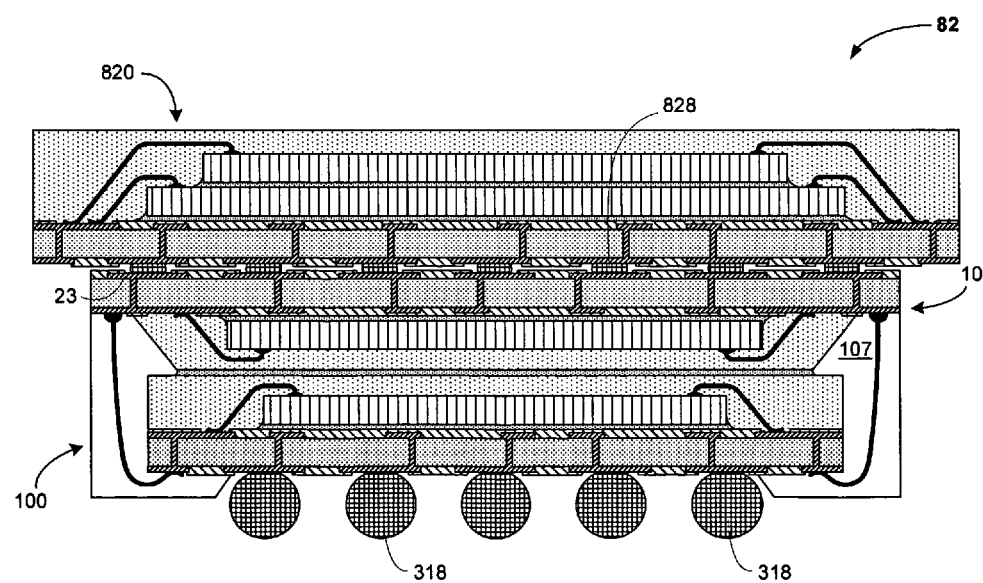

And for example, as shown in FIGS. 8A and 8B an additional land grid array (LGA) package can be mounted over an assembly constructed as described above with reference to FIG. 3. In FIG. 8A, a LGA package 810 having land interconnects 818 is aligned with and mounted upon the land side of a second package 10 substrate, and the land interconnects are reflowed onto pads in the metal layer 23 to form a module 80. Here the LGA footprint is smaller than that of the assembly; in the module 82 shown in FIG. 8B, the footprint of the LGA 820 is larger than that of the assembly, and the array has more land interconnects, which accordingly occupy more pads on the second package 10 substrate. Also, in the example of FIG. 8B, the LGA is a stacked die package, while in FIG. 8A the LGA is a single die package.

A configuration having a larger additional package mounted over the stacked package assembly as shown in FIGS. 7A and 8A may, for example, include processors in the first and second packages 10, 100, and a memory package as the additional package 720 or 820. The footprints of the CSP 100 and the LGA 10 in the assembly are determined principally by the dimensions of the die in the respective packages, and this generally relates to the functionality of the die. ASICs may be comparatively very small, for example, and different processors may be of significantly different sizes. Memory die, on the other hand, may be comparatively large. A digital signal processor (DSP) package, for example, has a footprint typically in the range 12×12 mm to 16×16 mm. A memory package, on the other hand, for example, typically has a footprint in the range 8×10 mm to 18×18 mm. Accordingly, if the assembly as in FIG. 3 includes a DSP in the first or the second package 10, 100 of the assembly, establishing a footprint of 16×16 mm for the assembly 3, the manufacturer may according to the specifications of the customer select either a smaller LGA memory package (e.g. 810 in FIG. 8A, giving a module 80) or a larger LGA memory package (e.g. 820 in FIG. 8B, giving a module 82). Thus, for embodiments as in FIGS. 7A, 7B, 8A, 8B, the manufacturer can mix-and-match assembly platforms with selected memory BGAs or LGAs according to function (memory capacity and speed; memory type) and according to costs from various suppliers.

Figure 9:
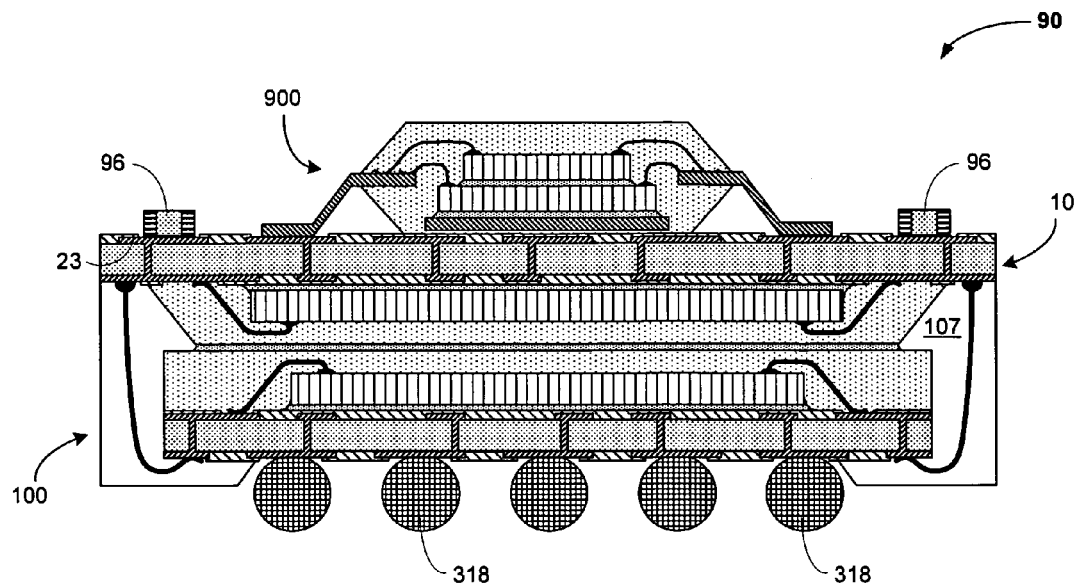
FIG. 9 is a diagrammatic sketch in a sectional view thru a stacked package assembly according to an embodiment of the invention, including a SD QFP stacked over an assembly according to an embodiment of the invention as shown in FIG. 3.
Figure 10:
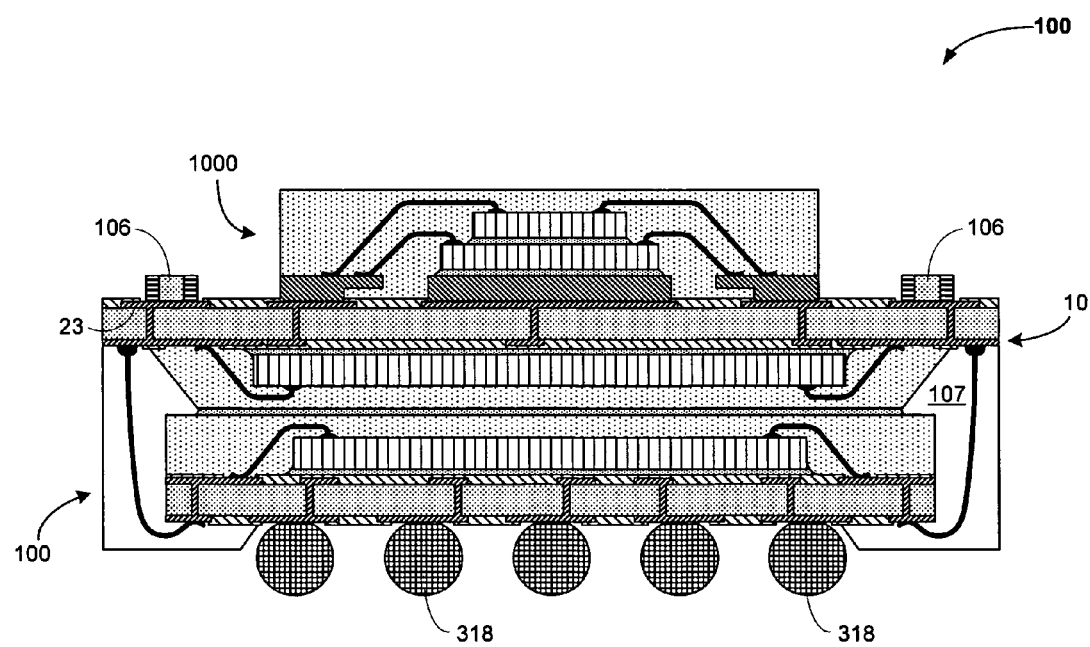
FIG. 10 is a diagrammatic sketch in a sectional view thru a stacked package assembly according to an embodiment of the invention, including a SD QFN/LFCSP stacked over an assembly according to an embodiment of the invention as shown in FIG. 3.
Figure 11:
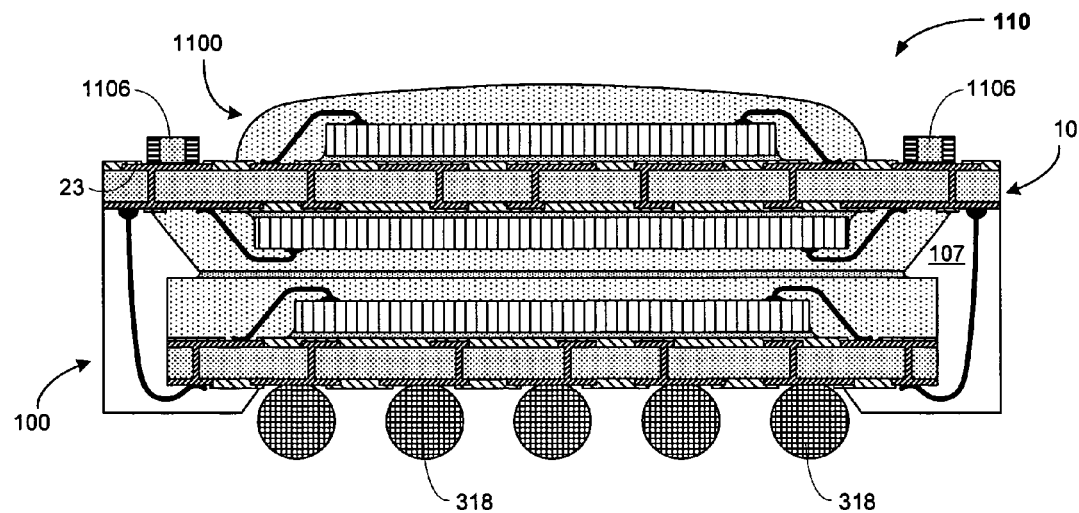
FIG. 11 is a diagrammatic sketch in a sectional view thru a stacked package assembly according to an embodiment of the invention, including a wire bonded die stacked over an assembly according to an embodiment of the invention as shown in FIG. 3.
Figure 12:
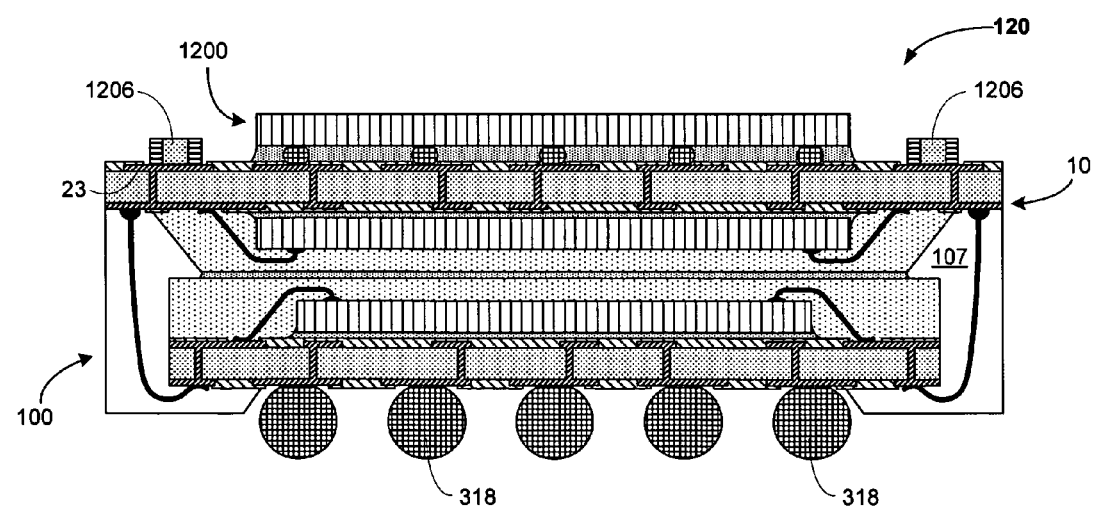
FIG. 12 is a diagrammatic sketch in a sectional view thru a stacked package assembly according to an embodiment of the invention, including a flip chip die stacked over an assembly according to an embodiment of the invention as shown in FIG. 3.
Figure 13:
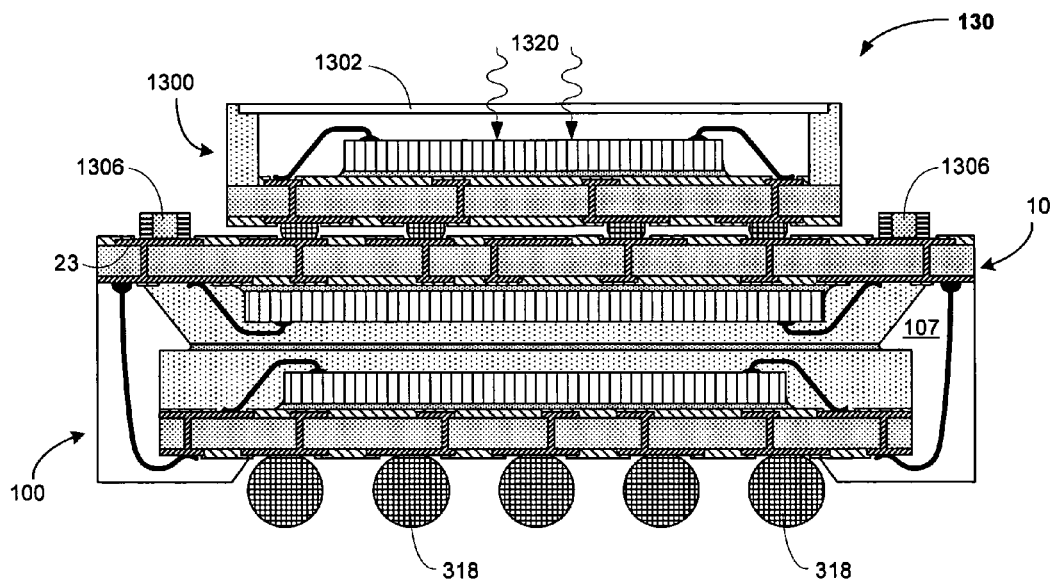
FIG. 13 is a diagrammatic sketch in a sectional view thru a stacked package assembly according to an embodiment of the invention, including an optical sensor package stacked over an assembly according to an embodiment of the invention as shown in FIG. 3.

Other additional components or devices can be mounted over the assembly, requiring only that the land side of the second package substrate be suitably routed to accept electrical interconnections from the component. FIG. 9 shows a module 90 having a stacked die quad flat package 900, accompanied by passive devices 96, mounted over a stacked package assembly constructed generally as in FIG. 3. FIG. 10 shows a module 100 having a stacked die quad flat nonleaded lead frame chip scale package 1000, accompanied by passive devices 106, mounted over a stacked package assembly constructed generally as in FIG. 3. FIG. 11 shows a module 110 having a wire bonded die 1100, accompanied by passive devices 1106, mounted over a stacked package assembly constructed generally as in FIG. 3; the die and wires are covered by a so-called "glop top" encapsulation, formed by syringe dispensing an encapsulating resin. FIG. 12 shows a module 120 having a flip chip mounted die 1200, accompanied by passive devices 1206, mounted over a stacked package assembly constructed generally as in FIG. 3; an underfill protects the flip chip interconnects. FIG. 13 shows a module 130 having an optical sensor package 1300, which may be an image forming device, accompanied by passive devices 1306, mounted over a stacked package assembly constructed generally as in FIG. 3; light passes through a transparent cover or lens 1302 as indicated by arrows 1320 to reach the active side of the wire-bonded light sensor die.

Figure 14:
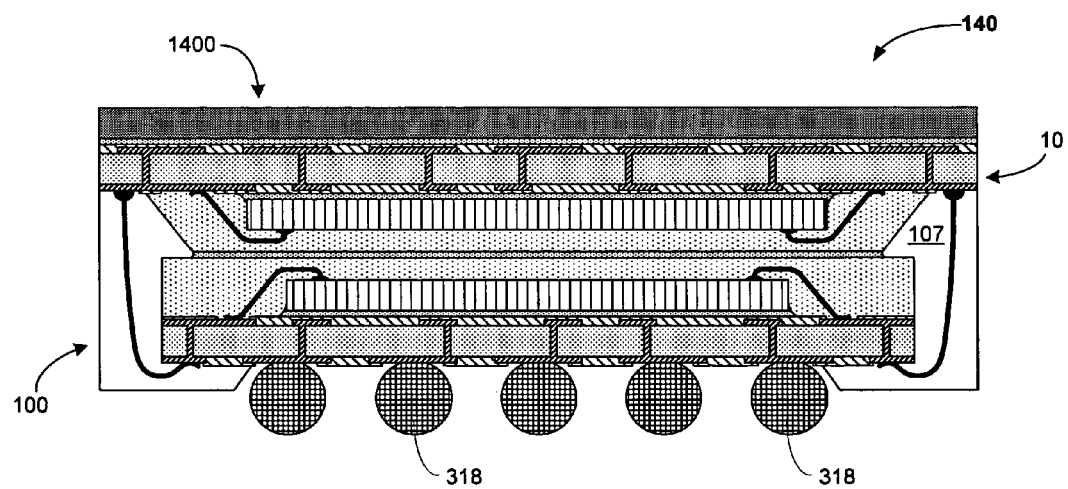
FIG. 14 is a diagrammatic sketch in a sectional view thru a stacked package assembly according to an embodiment of the invention, including a heat spreader stacked over an assembly according to an embodiment of the invention as shown in FIG. 3.

FIG. 14 shows an assembly 140, including a stacked package assembly generally as shown in FIG. 3, having a heat spreader 1400 mounted upon the land side of the second package substrate.

In other embodiments the additional package is attached to the assembly on the exposed area of the land side of the first package substrate, in the cavity in the assembly encapsulation. In these embodiments the assembly of FIG. 1 or 2, with second level interconnection on the land side of second package substrate, as shown in FIG. 4, can provide a useful platform upon which to stack components having additional functionalities, as shown for example in FIGS. 16 through 24. In embodiments employing the platform of FIG. 4, the traces on the first package substrate must suitably routed to accept the additional component.

Figure 18:
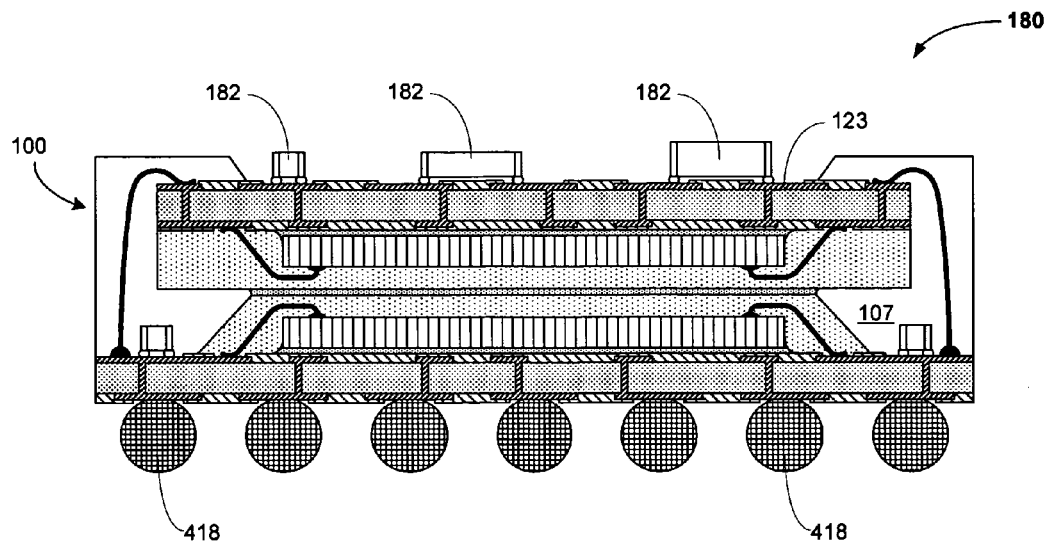
FIG. 18 is a diagrammatic sketch in a sectional view thru a stacked package assembly according to an embodiment of the invention, including passive devices mounted over an assembly according to an embodiment of the invention as shown in FIG. 4.
Figure 19:
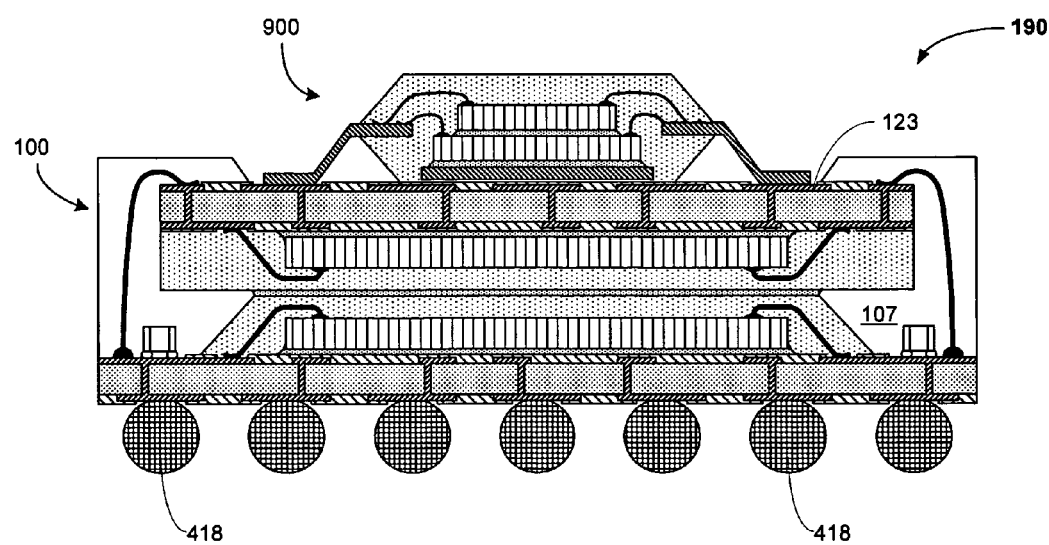
FIG. 19 is a diagrammatic sketch in a sectional view thru a stacked package assembly according to an embodiment of the invention, including a SD QFP stacked over an assembly according to an embodiment of the invention as shown in FIG. 4.
Figure 20:
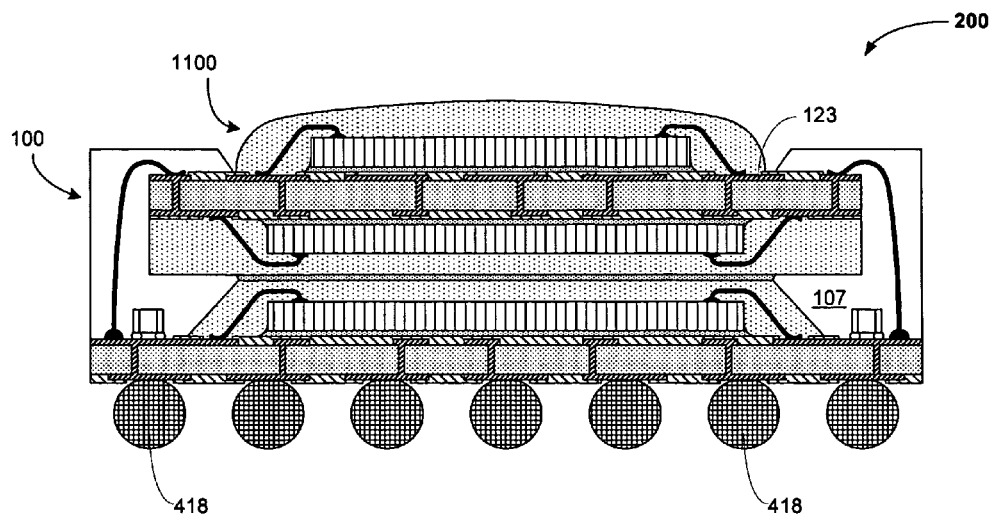
FIG. 20 is a diagrammatic sketch in a sectional view thru a stacked package assembly according to an embodiment of the invention, including a wire bonded die stacked over an assembly according to an embodiment of the invention as shown in FIG. 4.
Figure 21:
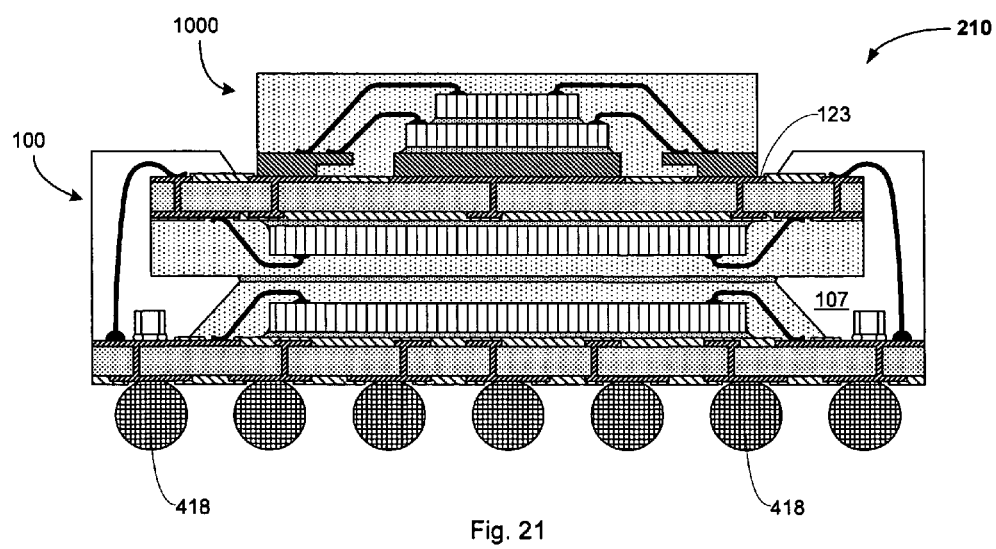
FIG. 21 is a diagrammatic sketch in a sectional view thru a stacked package assembly according to an embodiment of the invention, including a SD QFN/LFCSP stacked over an assembly according to an embodiment of the invention as shown in FIG. 4.
Figure 22:
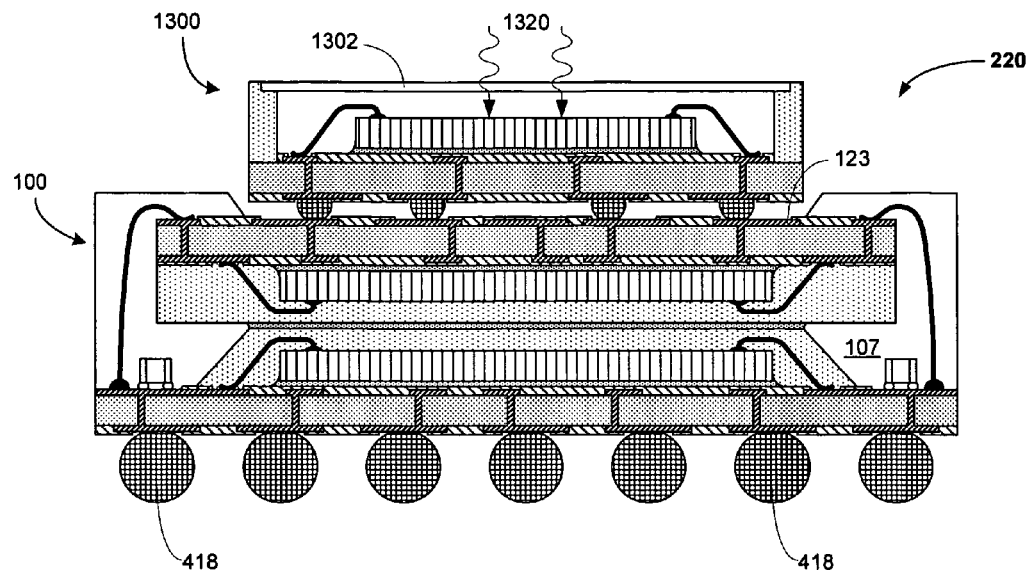
FIG. 22 is a diagrammatic sketch in a sectional view thru a stacked package assembly according to an embodiment of the invention, including an optical sensor package stacked over an assembly according to an embodiment of the invention as shown in FIG. 4.
Figure 23:
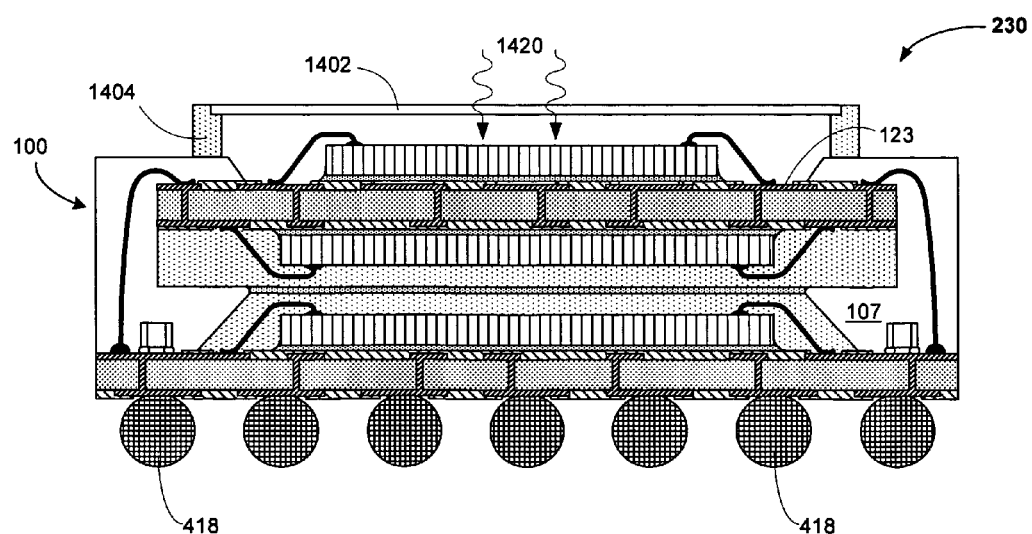
FIG. 23 is a diagrammatic sketch in a sectional view thru a stacked package assembly according to an embodiment of the invention, including an optical sensor die mounted on an assembly according to an embodiment of the invention as shown in FIG. 4.

For example, as shown in FIG. 16 a ball grid array (BGA) package can be mounted over an assembly constructed as described above with reference to FIG. 4. In FIG. 16, a BGA package 710 having interconnect solder balls 718 is aligned with and mounted upon the exposed area of the land side of a first package 100 substrate, and the solder balls are reflowed onto ball pads in the metal layer 123 to form a module 160. And for example, as shown in FIG. 17 an additional die can be mounted and electrically connected in a flip chip manner over an assembly constructed as described above with reference to FIG. 4. In FIG. 17, a flip chip 1200 is aligned with and mounted in the cavity upon the exposed area of the land side of a first package 100 substrate and connected to pads 123 to form a module 170. And for example, as shown in FIG. 18 additional passive devices can be mounted and electrically connected over an assembly constructed as described above with reference to FIG. 4. In FIG. 18, passive devices 182 are mounted in the cavity upon the exposed area of the land side of a first package 100 substrate and connected to pads 123 to form a module 170. And for example, as shown in FIG. 19 a stacked die quad flat package, can be mounted and electrically connected over an assembly constructed as described above with reference to FIG. 4. In FIG. 19, stacked die quad flat package 900 is mounted in the cavity upon the exposed area of the land side of a first package 100 substrate and connected to pads 123 to form a module 180. And for example, as shown in FIG. 20 an additional die can be mounted and electrically connected by wire bonding over an assembly constructed as described above with reference to FIG. 4. In FIG. 20, a die 1100 is mounted active side upward in the cavity upon the exposed area of the land side of a first package 100 substrate and connected by wire bonds to pads 123 to form a module 200. And for example, as shown in FIG. 21 a stacked die quad flat nonleaded lead frame chip scale package 1000 is mounted over a stacked package assembly constructed generally as in FIG. 4. In FIG. 21, stacked die quad flat nonleaded lead frame CSP 1000 is mounted in the cavity upon the exposed area of the land side of a first package 100 substrate and connected to pads 123 to form a module 210. And for example, as shown in FIG. 22 an optical sensor package 1300, which may be an image forming device, is mounted over a stacked package assembly constructed generally as in FIG. 4. In FIG. 22 optical sensor package 1300 is mounted in the cavity upon the exposed area of the land side of a first package 100 substrate and connected to pads 123 to form a module 220. Light passes through a transparent cover or lens 1302 as indicated by arrows 1320 to reach the active side of the wire-bonded light sensor die. And for example, as shown in FIG. 23, an optical sensor die, which may be an image forming device, is mounted over a stacked package assembly constructed generally as in FIG. 4. In FIG. 23 the die is connected by wire bonds to pads 123 to form a module 230. A transparent cover or lens 1402 is supported by a frame 1404 mounted upon the assembly encapsulation 107. Light passes through the transparent cover or lens 1402 as indicated by arrows 1420 to reach the active side of the wire-bonded light sensor die.

Figure 24:
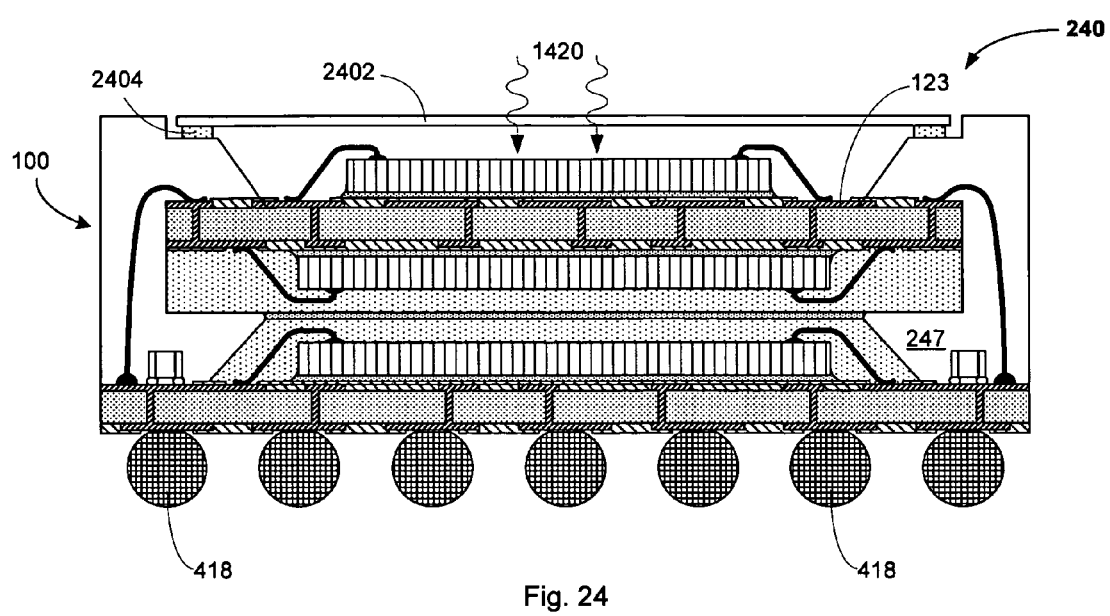
FIG. 24 is a diagrammatic sketch in a sectional view thru a stacked package assembly according to another embodiment of the invention, including an optical sensor die mounted on an assembly according to an embodiment of the invention as shown in FIG. 4.

As shown in FIG. 24, the cavity assembly encapsulation 247 is configured and dimensioned to accommodate the thickness of an optical sensor die mounted onto and electrically connected with the stacked package assembly as in FIG. 23, and a transparent cover or lens 2402 is supported by a perimeter seal 2404 mounted within a recess in the assembly encapsulation 247.

Figure 25:
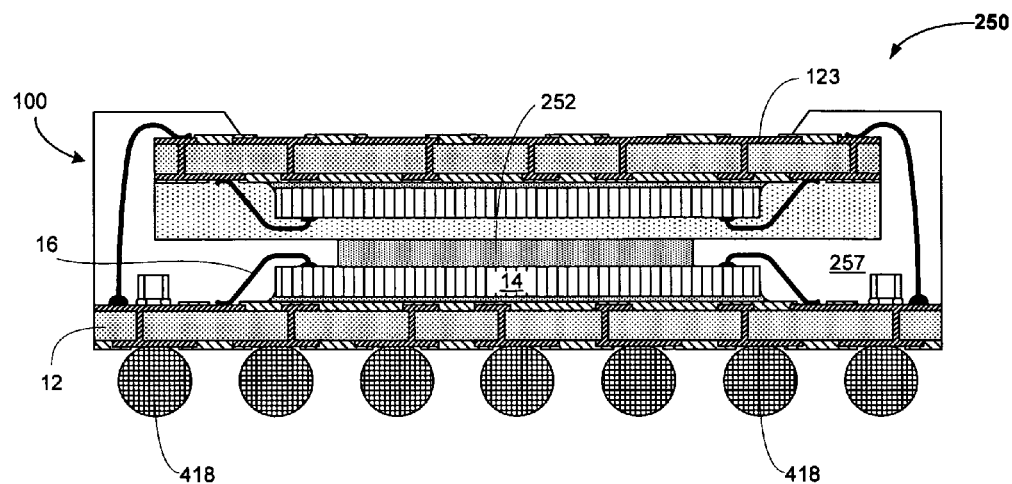
FIG. 25 is a diagrammatic sketch in a sectional view thru an embodiment of a stacked package assembly according to another aspect of the invention.

A platform according to another alternative embodiment is shown by way of example in FIG. 25. This embodiment is similar to the embodiment illustrated by way of example in FIG. 4. As explained above, in embodiments as in FIG. 4, the die 14 and wire bonds 16 are encapsulated with a molding compound forming a mold cap 17. In the platform as shown for example in FIG. 25, by contrast, there is no mold cap. The die 14 in the example of FIG. 25 is wire-bonded 16 to the second package substrate 12. A spacer 252 is provided at the active side of the die 14, and the first package 100 is inverted and mounted upon the spacer. The spacer provides clearance between the active side of the die and the (downward-facing) upper surface of the first package molding over the die 14 so that the first package does not impact the wire loops 16. The spacer can be affixed to the die using an adhesive (not shown in the FIG.) and the first package is affixed to the spacer using an adhesive (not shown). An assembly encapsulation 257 is formed generally as described with reference to FIG. 16.

Figure 26:
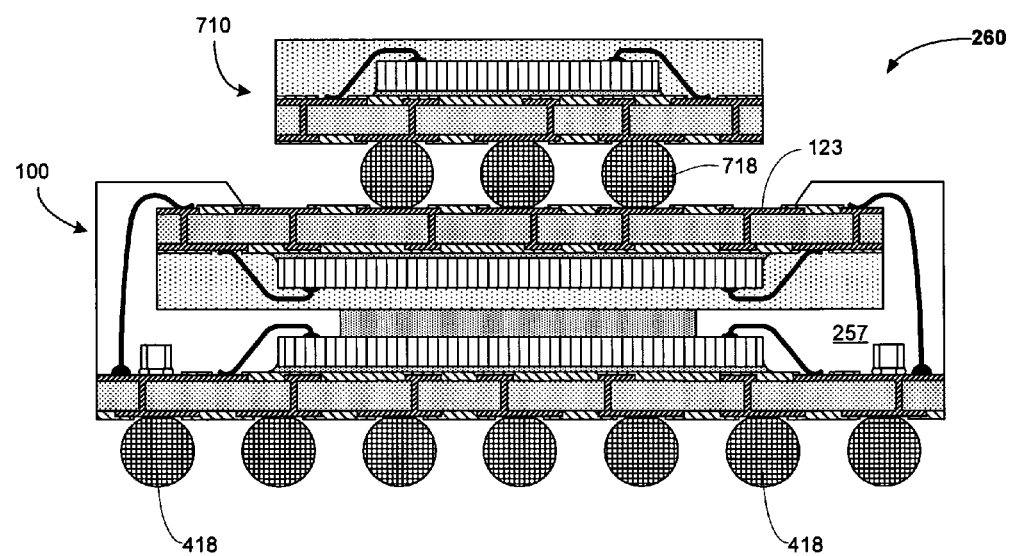
FIG. 26 is a diagrammatic sketch in a sectional view thru a stacked package assembly according to an embodiment of the invention, including a including a BGA stacked over an assembly according to an embodiment of the invention as shown in FIG. 23.

The platform as shown in FIG. 25 can have one or more additional components mounted over and electrically connected with the exposed area of the land side of the first package substrate, generally as described above with reference to FIGS. 16-24. For example, FIG. 26 shows a BGA package 710 mounted upon and electrically connected with the first package substrate (compare with FIG. 16).

A configuration having a larger additional package mounted over the stacked package assembly as shown in FIGS. 7A and 8A may, for example, include processors in the first and second packages 10, 100, and a memory package as the additional package 720 or 820. The footprints of the CSP 100 and the LGA 10 in the assembly are determined principally by the dimensions of the die in the respective packages, and this generally relates to the functionality of the die. ASICs may be comparatively very small, for example, and different processors may be of significantly different sizes. Memory die, on the other hand, may be comparatively large. A digital signal processor (DSP) package, for example, has a footprint typically in the range 12×12 mm to 16×16 mm. A memory package, on the other hand, for example, typically has a footprint in the range 8×10 mm to 18×18 mm. Accordingly, if the assembly as in FIG. 3 includes a DSP in the first or the second package 10, 100 of the assembly, establishing a footprint of 16×16 mm for the assembly 3, the manufacturer may according to the specifications of the customer select either a smaller LGA memory package (e.g. 810 in FIG. 8A, giving a module 80) or a larger LGA memory package (e.g. 820 in FIG. 8B, giving a module 82). Thus, for embodiments as in FIGS. 7A, 7B, 8A, 8B, the manufacturer can mix-and-match assembly platforms with selected memory BGAs or LGAs according to function (memory capacity and speed; memory type) and according to costs from various suppliers.

Other additional components or devices can be mounted over the assembly, requiring only that the land side of the second package substrate be suitably routed to accept electrical interconnections from the component. FIG. 9 shows a module 90 having a stacked die quad flat package 900, accompanied by passive devices 96, mounted over a stacked package assembly constructed generally as in FIG. 3. FIG. 10 shows a module 100 having a stacked die quad flat nonleaded lead frame chip scale package 1000, accompanied by passive devices 106, mounted over a stacked package assembly constructed generally as in FIG. 3. FIG. 11 shows a module 110 having a wire bonded die 1100, accompanied by passive devices 1106, mounted over a stacked package assembly constructed generally as in FIG. 3; the die and wires are covered by a so-called "glop top" encapsulation, formed by syringe dispensing an encapsulating resin. FIG. 12 shows a module 120 having a flip chip mounted die 1200, accompanied by passive devices 1206, mounted over a stacked package assembly constructed generally as in FIG. 3; an underfill protects the flip chip interconnects. FIG. 13 shows a module 130 having an optical sensor package 1300, which may be an image forming device, accompanied by passive devices 1306, mounted over a stacked package assembly constructed generally as in FIG. 3; light passes through a transparent cover or lens as indicated by arrows 1320 to reach the active side of the wire-bonded light sensor die.

As will be appreciated, in all its various aspects the invention features an assembly having a first (CSP) package and an inverted second (LGA) package stacked over the CSP package, and having wire bonding z-interconnect between the stacked packages, in which the assembly is encapsulated in such a way that the land side of the second (LGA) package is exposed and a portion of the land side of the first (CSP) package is exposed.

Moreover, the assembly constitutes a platform for combination with any of a variety of additional components. Accordingly, in various configurations second level interconnection of the assembly is made at the land side of one package (preferably the first package), and one or more additional components are stacked over the land side of the other package (preferably the second package). The additional components may be selected by the manufacturer on the product assembly floor, and may be selected from among off-the-shelf components.

The stacked package assembly of the invention can be employed in any of a diverse variety of applications, such as, for example, computers, portable communications devices, consumer products.

The stacked package assembly according to the invention can be used for building computers, and, for example, in telecommunications, consumer and industrial electronics devices. The invention provides for assembly of more than one semiconductor in a thin and minimal footprint package at high final test yields. Construction of the individual packages allows testing before they are assembled into the assembly, assuring that only acceptably good package components are employed in assembly and, accordingly, ensuring high assembly yields.

The invention provides for flexibility in design, particularly in selection of components having selected functionalities, and enables the use of standard packages, reducing the need for custom design and reducing cost.

Procedures in processes for making CSP packages and LGA packages for use in the invention are well established in the industry for both the wire bonded and the flip chip types of packages.

The assembly process is similar for the configurations according to the various aspects of the invention. Generally, the process includes steps of providing a cavity molded LGA package including a LGA package substrate and at least one die attached to the LGA package substrate, applying adhesive onto a surface of the mold cap of the LGA package, providing a matrix molded and saw singulated CSP package including a CSP package substrate and at least one die, inverting the CSP package in relation to the LGA package, placing the inverted CSP upon the adhesive on the LGA mold cap surface, curing the adhesive, and forming z-interconnects between the CSP and LGA substrates.

Advantageously, the packages can be tested prior to assembly, and package is not meeting requirements for performance or reliability can be discarded, so that first packages and second package is tested as "good" are used in the assembled module. Testing of LGAs and CSPs is well established in the industry, and typically is done by accessing contact to the solder ball pads. The LGAs can be tested in either of two ways, namely by accessing the LGA pads on the lower surface of the LGA of the substrate, similar to the pads of the solder balls in a BGA; or by accessing the z-interconnect pads on the upper surface of the substrate. The completed assembly can be tested in the same as for testing BGAs.

Figure 15:
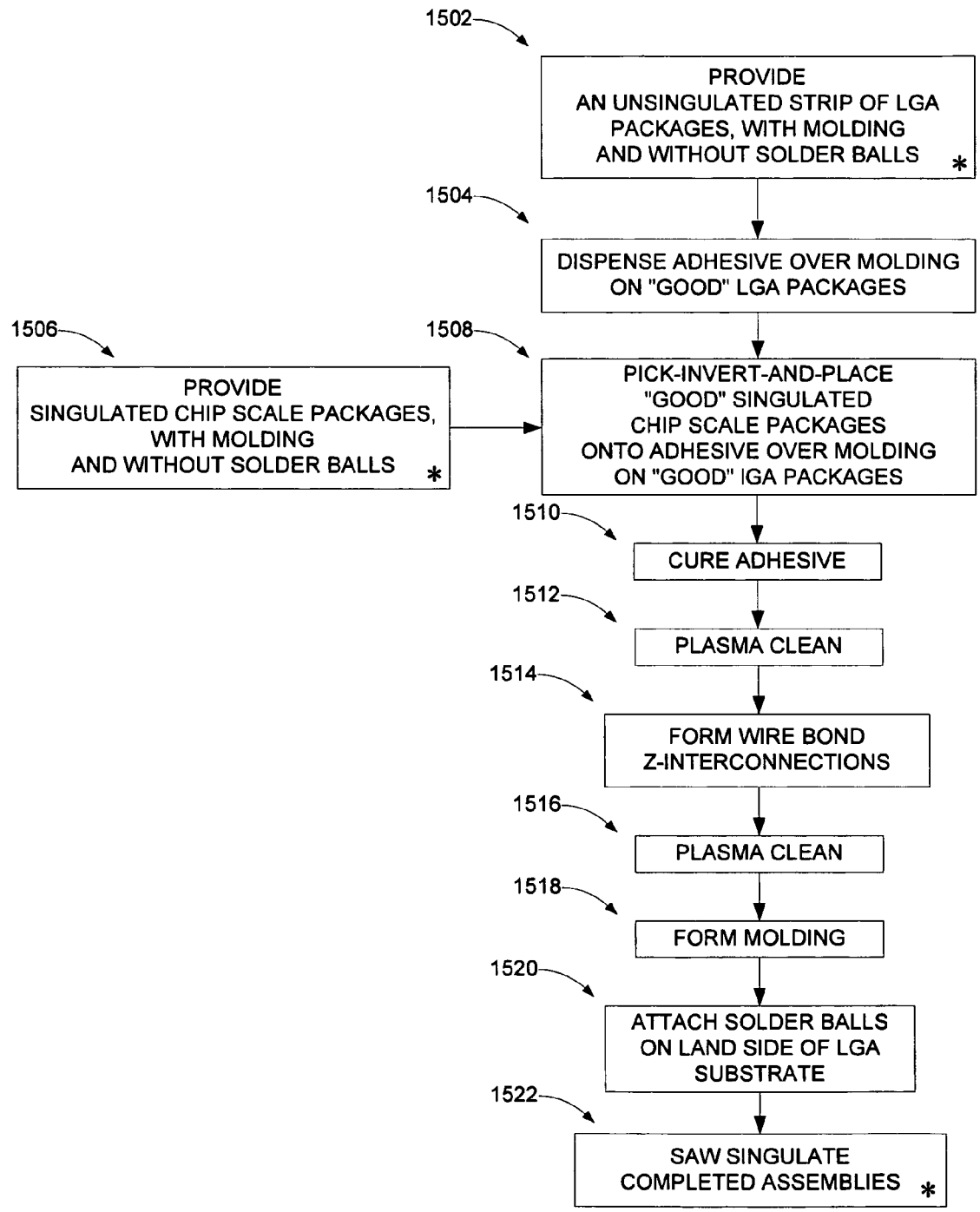
FIG. 15 is a diagram showing steps in a process for making a stacked package assembly according to an embodiment of the invention as in FIG. 3.

FIG. 15 is a flow diagram showing a process for assembly of a stacked package assembly as shown for example in FIG. 3. In a step 1502, an unsingulated strip of land grid array packages is provided. The die and wire bond structures on the land grid array packages are protected by a molding. The LGA packages in the strip preferably are tested (as indicated in the FIG. by *) for performance and reliability before they are taken to subsequent steps in the process. Only packages identified as "good" are subjected to subsequent treatment. In a step 1504, adhesive is dispensed over the upper surface of the molding on "good" LGA packages. In a step 1506, singulated chip scale packages are provided. The singulated CSP packages are protected by a molding, and preferably are tested (*) and identified as "good". In a step 1508, a pick-and-place operation is carried out to invert and place "good" CSP packages on the adhesive over the molding on the "good" LGA packages. In a step 1510, the adhesive is cured. In a step 1512, a plasma clean operation is performed in preparation for a step 1514 in which wire bond z-interconnections are formed between wire bond sites on the land sides of the stacked LGA and CSP. In a step 1516, an additional plasma clean may be performed, followed by the formation of the stacked package assembly molding in a step 1518. The molding apparatus is configured to allow molding compound to encapsulate the z-interconnection wire loops, and to prevent incursion of molding compound into an inner area of the land side of the CSP. In a step 1520, the second-level interconnect solder balls are attached to the exposed inner area of the land side of the CSP. In a step 1522, the completed assemblies are tested (*) and singulated from the strip by saw singulation, and packaged for further use.

Figure 27:
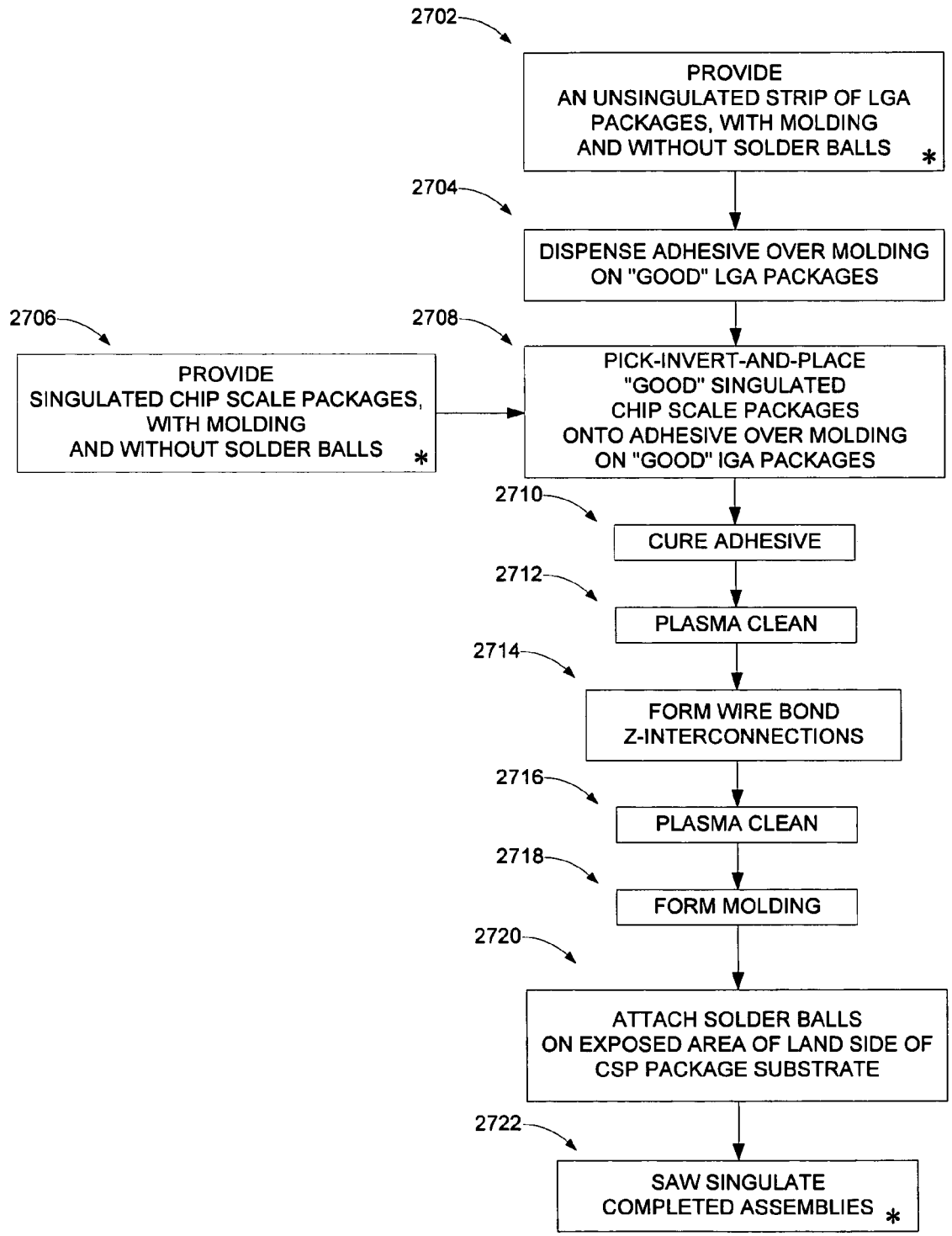
FIG. 27 is a diagram showing steps in a process for making a stacked package assembly according to an embodiment of the invention as in FIG. 25.

FIG. 27 is a flow diagram showing a process for assembly of a stacked package assembly as shown for example in FIG. 4. In a step 2702, an unsingulated strip of land grid array packages is provided. The die and wire bond structures on the land grid array packages are protected by a molding. The LGA packages in the strip preferably are tested (as indicated in the FIG. by *) for performance and reliability before they are taken to subsequent steps in the process. Only packages identified as "good" are subjected to subsequent treatment. In a step 2704, adhesive is dispensed over the upper surface of the molding on "good" LGA packages. In a step 2706, singulated chip scale packages are provided. The singulated CSP packages are protected by a molding, and preferably are tested (*) and identified as "good". In a step 2708, a pick-and-place operation is carried out to invert and place "good" CSP packages on the adhesive over the molding on the "good" LGA packages. In a step 2710, the adhesive is cured. In a step 2712, a plasma clean operation is performed in preparation for a step 2714 in which wire bond z-interconnections are formed between wire bond sites on the land sides of the stacked LGA and CSP. In a step 2716, an additional plasma clean may be performed, followed by the formation of the stacked package assembly molding in a step 2718. The molding apparatus is configured to allow molding compound to encapsulate the z-interconnection wire loops, and to prevent incursion of molding compound into an inner area of the land side of the CSP. In a step 2720, the second-level interconnect solder balls are attached to the exposed land side of the LGA. In a step 2722, the completed assemblies are tested (*) and singulated from the strip by saw singulation, and packaged for further use.

Figure 28:
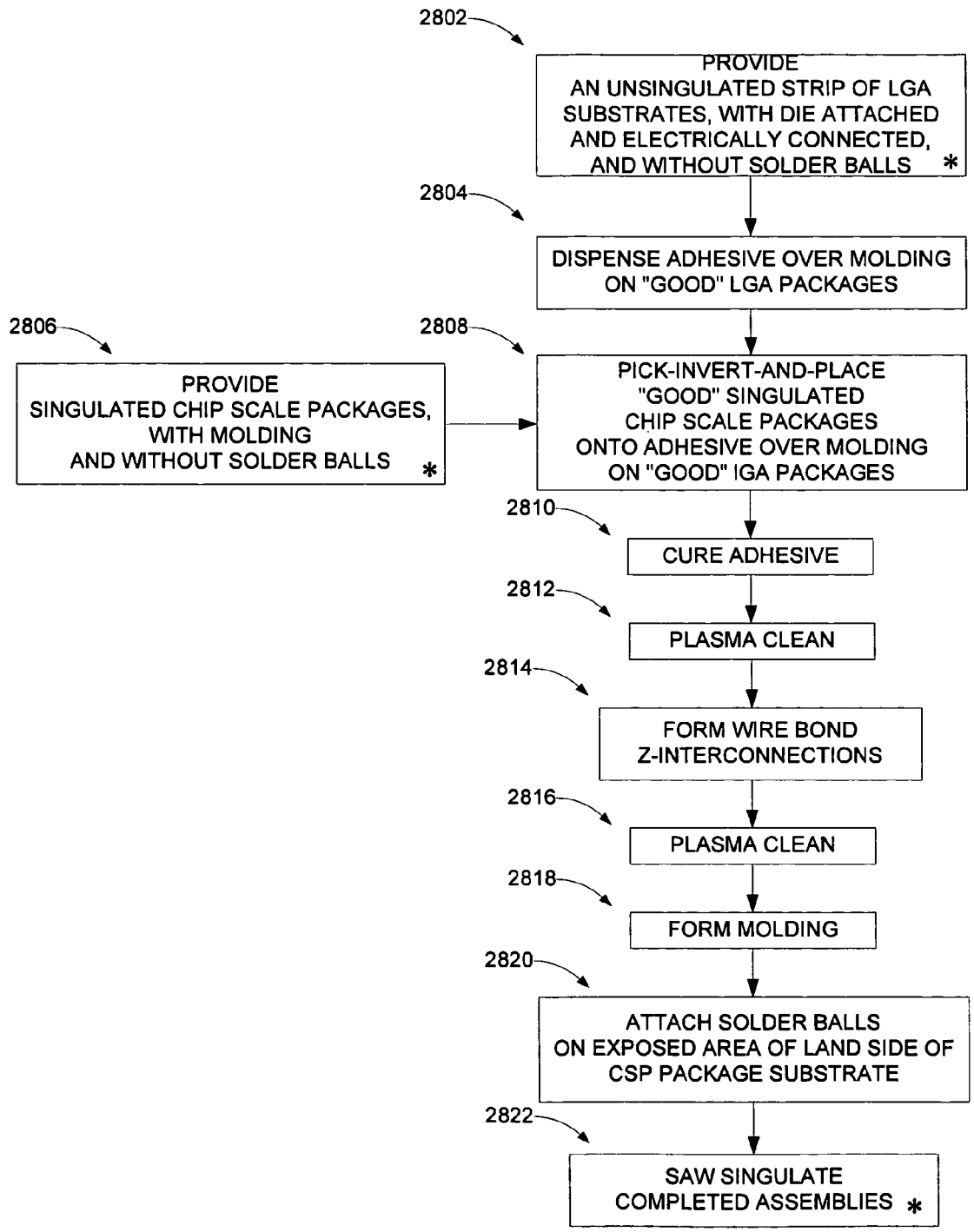
FIG. 28 is a diagram showing steps in a process for making a stacked package assembly according to an embodiment of the invention as in FIG. 4.

FIG. 28 is a flow diagram showing a process for assembly of a stacked package assembly as shown for example in FIG. 25. In a step 2802, an unsingulated strip of land grid array substrates, having die mounted and electrically connected, is provided. The die and wire bond structures on the land grid array packages are protected by a molding. The LGA packages in the strip preferably are tested (as indicated in the FIG. by *) for performance and reliability before they are taken to subsequent steps in the process. Only packages identified as "good" are subjected to subsequent treatment. In a step 2804, adhesive is dispensed over the upper surface of the molding on "good" LGA packages. In a step 2806, singulated chip scale packages are provided. The singulated CSP packages are protected by a molding, and preferably are tested (*) and identified as "good". In a step 2808, a pick-and-place operation is carried out to invert and place "good" CSP packages on the adhesive over the molding on the "good" LGA packages. In a step 2810, the adhesive is cured. In a step 2812, a plasma clean operation is performed in preparation for a step 2814 in which wire bond z-interconnections are formed between wire bond sites on the land sides of the stacked LGA and CSP. In a step 2816, an additional plasma clean may be performed, followed by the formation of the stacked package assembly molding in a step 2818. The molding apparatus is configured to allow molding compound to encapsulate the z-interconnection wire loops, and to prevent incursion of molding compound into an inner area of the land side of the CSP. In a step 2820, the second-level interconnect solder balls are attached to the exposed land side of the LGA. In a step 2822, the completed assemblies are tested (*) and singulated from the strip by saw singulation, and packaged for further use.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

What is claimed is:

1. A stacked package assembly, comprising first and second stacked packages, each package comprising a substrate having a die attach side and a land side, each package including at least one die affixed to, and electrically interconnected with, the die attach side of the package substrate, wherein one package is inverted in relation to the other, and wherein z-interconnection of the packages is by wire bonds connecting the first and second package substrates, the assembly further being encapsulated so that both the second package substrate at one side of the assembly and a portion of the first package substrate at an opposite side of the assembly are exposed, whereby second level interconnection and interconnection with additional components may be made.

2. The package assembly of claim 1 further comprising second level interconnections at the exposed land side of the second package substrate.

3. The package assembly of claim 1 further comprising second level interconnections at the exposed portion of the land side of the first package substrate.

4. The package assembly of claim 1 wherein the second package is a land grid array package.

5. The package assembly of claim 1 wherein the first package is a matrix molded and saw singulated chip scale package.

6. The package assembly of claim 1 wherein the second package is a cavity molded land grid array package.

7. The package assembly of claim 1, there being no separate molding over the die on the second substrate.

8. The package assembly of claim 1, further comprising an assembly encapsulation.

9. The package assembly of claim 1 wherein the first package is a stacked die chip scale package.

10. The package assembly of claim 1 wherein the second package is a stacked die land grid array package.

11. The package assembly of claim 1 wherein the die in the first package is interconnected with the first package substrate by wire bonding.

12. The package assembly of claim 1 wherein the die in the first package is interconnected with the first package substrate by flip chip interconnection.

13. The package assembly of claim 1 wherein the die in the second package is interconnected with the first package substrate by wire bonding.

14. The package assembly of claim 1 wherein the die in the second package is interconnected with the second package substrate by flip chip interconnection.

15. A stacked package assembly comprising a land grid array package substrate exposed in the center thereof at one side of the assembly and a portion of a chip scale package substrate exposed at the opposite side of the assembly, further comprising second level interconnection at the exposed portion of the chip scale package substrate and having at least one additional component mounted at the exposed land grid array package substrate.

16. The package assembly of claim 15 wherein the additional component includes at least one of: a ball grid array package, an additional land grid array package, a quad flat package, a quad flat nonleaded package, a lead frame chip scale package, a wire bonded die, a flip chip die, an optical sensor package, a micro-electro-mechanical sensor package, or a passive device.

17. A stacked package assembly comprising a land grid array package substrate exposed in the center thereof at one side of the assembly and a portion of a chip scale package substrate exposed at the opposite side of the assembly, further comprising second level interconnection at the exposed land grid array package substrate and having at least one additional component mounted at the exposed portion of the chip scale package substrate.

18. The package assembly of claim 17 wherein the additional component includes at least one of: a ball grid array package, an additional land grid array package, a quad flat package, a quad flat nonleaded package, a lead frame chip scale package, a wire bonded die, a flip chip die, an optical sensor package, a micro-electro-mechanical sensor package, or a passive device.

19. A method for making a stacked package assembly, comprising: providing a cavity molded LGA package; applying an adhesive onto the surface of the mold cap of the LGA package; providing a singulated CSP; inverting the CSP and placing the inverted CSP onto the adhesive on the LGA mold cap; curing the adhesive;

performing a plasma clean following curing the adhesive; wire bonding to form z-interconnection between the die attach side of the LGA and the land side of the CSP; performing a plasma clean following wire bonding; performing a molding operation to enclose the die attach side of the LGA, the z-interconnection wire bonds and wire loops, the edges of the CSP, and a marginal area on the land side of the CSP, leaving exposed the land side of the LGA substrate and an area of the land side of the CSP substrate located within the marginal area; and attaching second level interconnect solder balls to sites on the exposed area of the CSP substrate.

20. A method for making a stacked package assembly, comprising: providing a cavity molded LGA package; applying an adhesive onto the surface of the mold cap of the LGA package; providing a singulated CSP; inverting the CSP and placing the inverted CSP onto the adhesive on the LGA mold cap; curing the adhesive; performing a plasma clean following curing the adhesive; wire bonding to form z-interconnection between the die attach side of the LGA and the land side of the CSP;

performing a plasma clean following wire bonding; performing a molding operation to enclose the die attach side of the LGA, the z-interconnection wire bonds and wire loops, the edges of the CSP, and a marginal area on the land side of the CSP, leaving exposed the land side of the LGA substrate and an area of the land side of the CSP substrate located within the marginal area; and attaching second level interconnect solder balls to sites on the exposed side of the LGA package substrate.

21. The method of claim 19, further comprising affixing and electrically connecting an additional component at the exposed land side of the LGA substrate.

22. The method of claim 20, further comprising affixing and electrically connecting an additional component at the exposed portion of the CSP substrate.

23. A method for making a stacked package assembly comprising: providing an LGA substrate; mounting and electrically connecting a die onto a die attach side of the LGA substrate; applying an adhesive onto the die on the LGA substrate; providing a singulated CSP; inverting the CSP and placing the inverted CSP onto the adhesive on the die on the LGA substrate; curing the adhesive; performing a plasma clean following curing the adhesive; wire bonding to form z-interconnection between the die attach side of the LGA substrate and the land side of the CSP; performing a plasma clean following wire bonding; performing a molding operation to enclose the die attach side of the LGA, the z-interconnection wire bonds and wire loops, the edges of the CSP, and a marginal area on the land side of the CSP, leaving exposed the land side of the LGA substrate and an area of the land side of the CSP substrate located within the marginal area; and attaching second level interconnect solder balls to sites on the exposed land side of the LGA substrate.

24. The method of claim 23, further comprising affixing and electrically connecting an additional component at the exposed portion of the CSP substrate.

* * * * *